(12) United States Patent
Takahashi et al.

(10) Patent No.: US 12,334,404 B2
(45) Date of Patent: Jun. 17, 2025

(54) SURFACE POSITION DETECTION DEVICE, EXPOSURE APPARATUS, SUBSTRATE-PROCESSING SYSTEM, AND DEVICE-MANUFACTURING METHOD

(71) Applicant: NIKON CORPORATION, Tokyo (JP)

(72) Inventors: Satoshi Takahashi, Kumagaya-shi (JP); Michio Ohashi, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 865 days.

(21) Appl. No.: 17/429,650

(22) PCT Filed: Feb. 21, 2019

(86) PCT No.: PCT/JP2019/006506
§ 371 (c)(1),
(2) Date: Nov. 17, 2021

(87) PCT Pub. No.: WO2020/170382
PCT Pub. Date: Aug. 27, 2020

(65) Prior Publication Data
US 2022/0216119 A1 Jul. 7, 2022

(51) Int. Cl.
*G03F 9/00* (2006.01)
*G01B 11/27* (2006.01)
*H01L 21/66* (2006.01)

(52) U.S. Cl.
CPC ............ *H01L 22/20* (2013.01); *G01B 11/272* (2013.01); *G03F 9/7026* (2013.01)

(58) Field of Classification Search
CPC . G01B 11/0608; G01B 11/272; G01B 11/026; G01B 11/03; G02B 21/245;
(Continued)

(56) References Cited

U.S. PATENT DOCUMENTS 5,162,642 A * 11/1992 Akamatsu ............ G03F 9/7026
250/559.3
5,191,200 A 3/1993 van der Werf et al.
(Continued)

FOREIGN PATENT DOCUMENTS

JP   H05-129182 A   5/1993
JP   2014-032104 A   2/2014
(Continued)

OTHER PUBLICATIONS

Sep. 8, 2022 Extended European Search Report issued in European Patent Application No. 19915683.7.
(Continued)

*Primary Examiner* — Peter B Kim
(74) *Attorney, Agent, or Firm* — Oliff PLC

(57) ABSTRACT

A surface position detection device that information of a detected surface along an axis that intersects the detected surface includes: a light transmission unit having a modulated intensity in the detected surface in a first direction within the detected surface are radiated and superimposed onto the detected surface obliquely from a direction having a direction component in the first direction and forms an irradiation region on the detected surface; a light reception unit arranged with respect to the detected surface, receives at a different position of each light reception surface, the plurality of detection lights reflected by a detection region of which a width in the first direction is a predetermined value in the irradiation region, and outputs photoelectric conversion signal of the plurality of detection lights; and calculates the detected surface based on the photoelectric conversion signal of the plurality of detection lights output from the light reception unit.

34 Claims, 14 Drawing Sheets

(58) Field of Classification Search
CPC .......... G02B 27/283; G02B 5/04; G02B 5/18;
G02B 27/0972; G03F 9/7023; G03F
9/7026; G03F 9/7034; H01L 22/20; H01L
21/0274
See application file for complete search history.

(56) References Cited

U.S. PATENT DOCUMENTS

| | | |
|---|---|---|
| 5,331,369 A | 7/1994 | Terasawa et al. |
| 5,633,721 A | 5/1997 | Mizutani |
| 2010/0231881 A1 | 9/2010 | Den Boef et al. |
| 2013/0128247 A1 | 5/2013 | Khuat Duy et al. |
| 2014/0036251 A1 | 2/2014 | Okada |
| 2015/0042969 A1* | 2/2015 | Morikuni .............. G03F 9/7023 355/55 |
| 2018/0341188 A1 | 11/2018 | Reijnders |

FOREIGN PATENT DOCUMENTS

| | | | | |
|---|---|---|---|---|
| JP | 2018-500598 A | 1/2018 | | |
| WO | WO-2013168456 A1 * | 11/2013 | ........... | G03F 9/7034 |

OTHER PUBLICATIONS

May 28, 2019 International Search Report issued in International Patent Application No. PCT/JP2019/006506.
May 28, 2019 Written Opinion issued in International Patent Application No. PCT/JP2019/006506.
Oct. 15, 2024 Office Action issued in Japanese Patent Application No. 2024-015552.

* cited by examiner (a)

(b)

SURFACE POSITION DETECTION DEVICE, EXPOSURE APPARATUS, SUBSTRATE-PROCESSING SYSTEM, AND DEVICE-MANUFACTURING METHOD

TECHNICAL FIELD

The present invention relates to a surface position detection device, an exposure apparatus, a substrate-processing system, and a device-manufacturing method.

BACKGROUND

In an exposure apparatus in which a pattern formed on a mask is projected and exposed onto a photosensitive substrate via a projection optical system, a depth of focus of the projection optical system is relatively shallow, and an exposed surface (surface: transfer surface) of the photosensitive substrate may not be flat. Therefore, in the exposure apparatus, it is necessary to accurately perform position alignment of a surface of the photosensitive substrate relative to an image surface (imaging surface) of the projection optical system.

For example, an oblique-incidence-type surface position detection device is known as a device that detects a surface position (surface position of the exposed surface) of the photosensitive substrate along an optical axis direction of the projection optical system (refer to Patent Document 1).

RELATED ART DOCUMENTS

Patent Document

[Patent Document 1] United States patent application, Publication No. 2010/0231881

SUMMARY OF INVENTION

A surface position detection device of a first aspect of the embodiment is a surface position detection device that obtains position information of a detected surface along an axis that intersects the detected surface, the surface position detection device including: a light transmission unit by which a plurality of detection lights having a smoothly modulated intensity in the detected surface in a first direction within the detected surface are radiated and superimposed onto the detected surface obliquely from a direction having a direction component in the first direction and which forms an irradiation region on the detected surface; a light reception unit that has a light detection portion having a light reception surface arranged at an optically conjugated position with respect to the detected surface, receives at a different position of each light reception surface, the plurality of detection lights reflected by a detection region of which a width in the first direction is a predetermined value in the irradiation region, and outputs each photoelectric conversion signal of the plurality of detection lights; and a calculation unit that calculates position information of the detected surface based on the photoelectric conversion signal of the plurality of detection lights output from the light reception unit.

A surface position detection device of a second aspect of the embodiment obtains position information of a detected surface along an axis that intersects the detected surface, the surface position detection device including: a light transmission unit by which a plurality of detection lights having a modulated intensity in the detected surface in a first direction within the detected surface are radiated and superimposed onto the detected surface obliquely from a direction having a direction component in the first direction and which forms an irradiation region on the detected surface; a light reception unit that has a light detection portion having a light reception surface arranged at an optically conjugated position with respect to the detected surface, receives at a different position of the light reception surface, each of the plurality of detection lights reflected by a detection region of which a width in the first direction is a predetermined value in the irradiation region, and outputs each photoelectric conversion signal of the plurality of detection lights; and a calculation unit that calculates position information of the detected surface based on the photoelectric conversion signal of the plurality of detection lights output from the light reception unit, wherein a width of a third direction having an imaging relationship with the first direction of an image of the detection region in the light reception surface is narrower than a width of a fourth direction that intersects the third direction in the light reception surface.

An exposure apparatus of a third aspect of the embodiment includes: a projection optical system; a substrate stage on which a substrate is mounted and which moves the substrate; and a surface position detection device of the first aspect or the second aspect that detects a position of a surface of the substrate as the detected surface.

A device-manufacturing method of a fourth aspect of the embodiment includes: forming a resist on a surface of a substrate; detecting a position of a surface of the resist formed on the surface of the substrate using the exposure apparatus of the third aspect, setting the surface of the resist at a predetermined position in the optical axis direction of the projection optical system, and exposing an exposure pattern; developing the resist; and processing the surface of the substrate based on a resist pattern formed by the developing.

A substrate-processing system of a fifth aspect of the embodiment is a system in which a substrate is a processing target, the substrate-processing system including: a measurement device having a first stage on which the substrate is mounted and the surface position detection device of the first aspect or the second aspect that measures a position in a direction which intersects the surface of a plurality of points on a surface of the substrate; and an exposure apparatus that includes a second stage on which the substrate for which the measurement by the measurement device has been completed is mounted and that exposes the substrate which is mounted on the second stage, wherein the exposure apparatus performs the exposure while changing a position in the direction which intersects the substrate using at least a measurement result by the measurement device.

A device-manufacturing method of a sixth aspect of the embodiment includes: forming a resist on a surface of a substrate; detecting a position in a direction which intersects the surface of a plurality of points in a surface of the resist formed on the surface of the substrate and exposing an exposure pattern while changing the position of the surface of the resist in the direction which intersects the surface based on the detected position of the plurality of points using the substrate-processing system of the fifth aspect; and forming a circuit pattern based on the exposure pattern.

BRIEF DESCRIPTION OF THE DRAWINGS

FIG. 6 is a view of an incident surface 23a of a light reception prism 23 when seen from a normal direction with respect to the incident surface 23a.

FIG. 8 is a view showing an image of a P-polarization component of an opening portion SL formed on the light reception surface 29a.

DESCRIPTION OF EMBODIMENTS

In the present specification, "optically conjugated" means that one surface and another surface have an imaging relationship via an optical system.

In the present specification, "imaging relationship" means a relationship in which light emitted from an arbitrary one point in one region is focused in a range of about the resolution of an optical system centered at one point in another region via the optical system.

In the present specification, "sinusoidal function" means a function in which a predetermined constant is added to a sine function (sin) or a cosine function (cos), and all values are non-negative.

(Surface Position Detection Device of First Embodiment)

Figure 1:
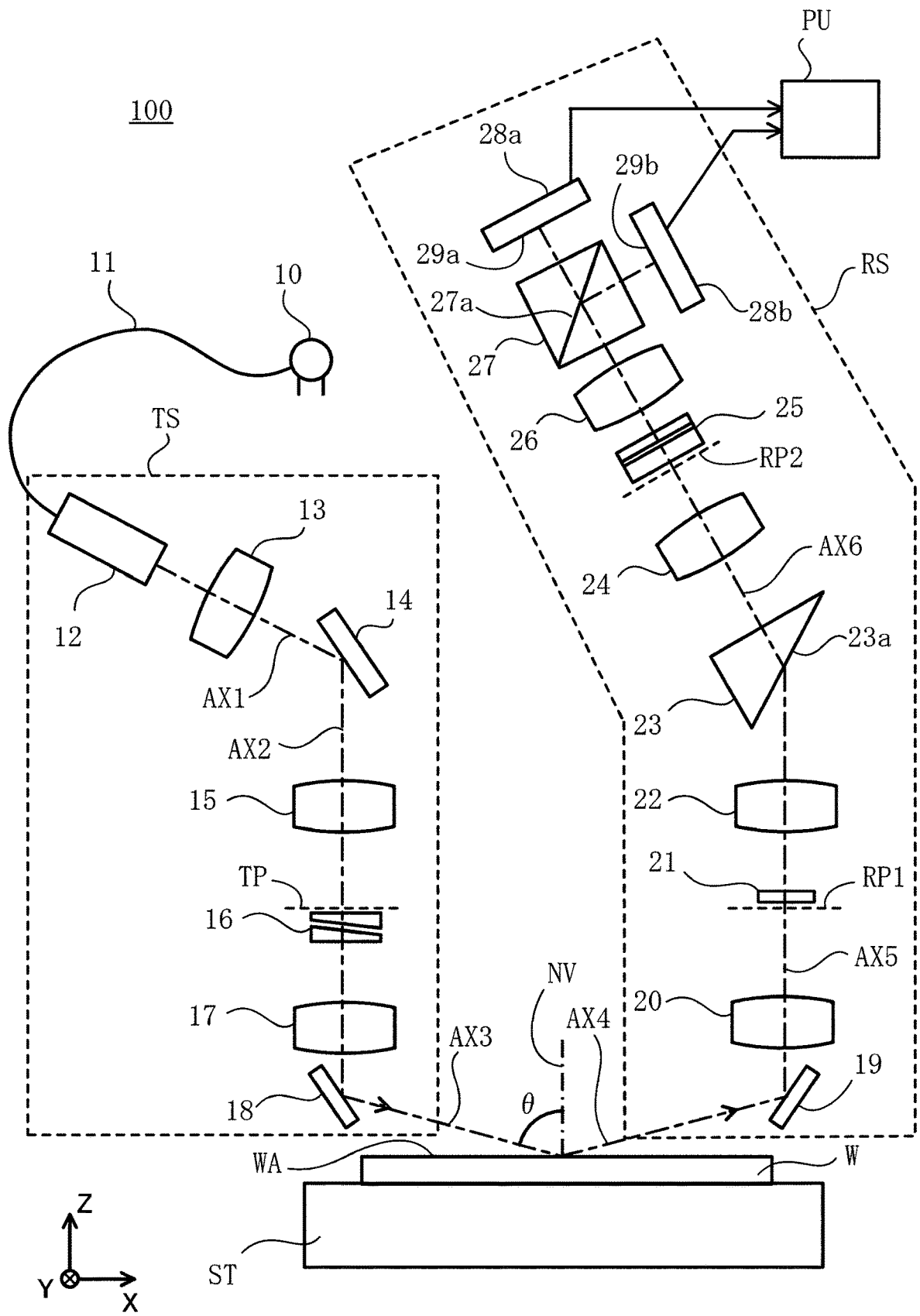
FIG. 1 is a view schematically showing a configuration of a surface position detection device 100 of a first embodiment.

FIG. 1 is a view schematically showing a configuration of a surface position detection device 100 of a first embodiment. In FIG. 1, a Z-axis is set in a direction (normal direction) perpendicular to a surface (hereinafter, also referred to as a "detected surface") WA of a measured object W mounted on the surface position detection device 100, an X-axis is set to be parallel to a paper plane of FIG. 1 within a plane perpendicular to the Z-axis, that is, within a plane parallel to the detected surface WA, and a Y-axis is set to be perpendicular to the paper plane of FIG. 1.

An outline of a path of detection light in the surface position detection device 100 of the first embodiment is described. The detection light is supplied to a light introduction portion 12, for example, from a light source 10 via a light guide 11. A wavelength band of the detection light from the light source 10 is, as an example, 400 nm to 800 nm, but is not limited thereto. For example, the wavelength band may be 400 nm or less and be, as an example, near 200 nm, or may be an infrared band of 800 nm or more and be, as an example, 1200 nm to 1700 nm. The detected surface WA is irradiated with the detection light emitted from the light introduction portion 12 via a condenser lens group 13, a diffraction grating plate 14, a light transmission-side second lens group 15, a light transmission-side first lens group 17, a mirror 18, and the like. The detection light reflected by the detected surface WA reaches a light reception prism 23 via a mirror 19, a light reception-side first lens group 20, a light reception-side second lens group 22, and the like. The detection light refracted by the light reception prism 23 enters a polarization separation prism 27 via a relay optical system constituted of a front-side lens group 24 and a rear-side lens group 26. Then, the detection light is separated into two different polarization components at the polarization separation prism 27, and one of the separated detection lights enters a light reception surface 29a of a light detection portion 28a and the other enters a light reception surface 29b of a light detection portion 28b.

Figure 2:
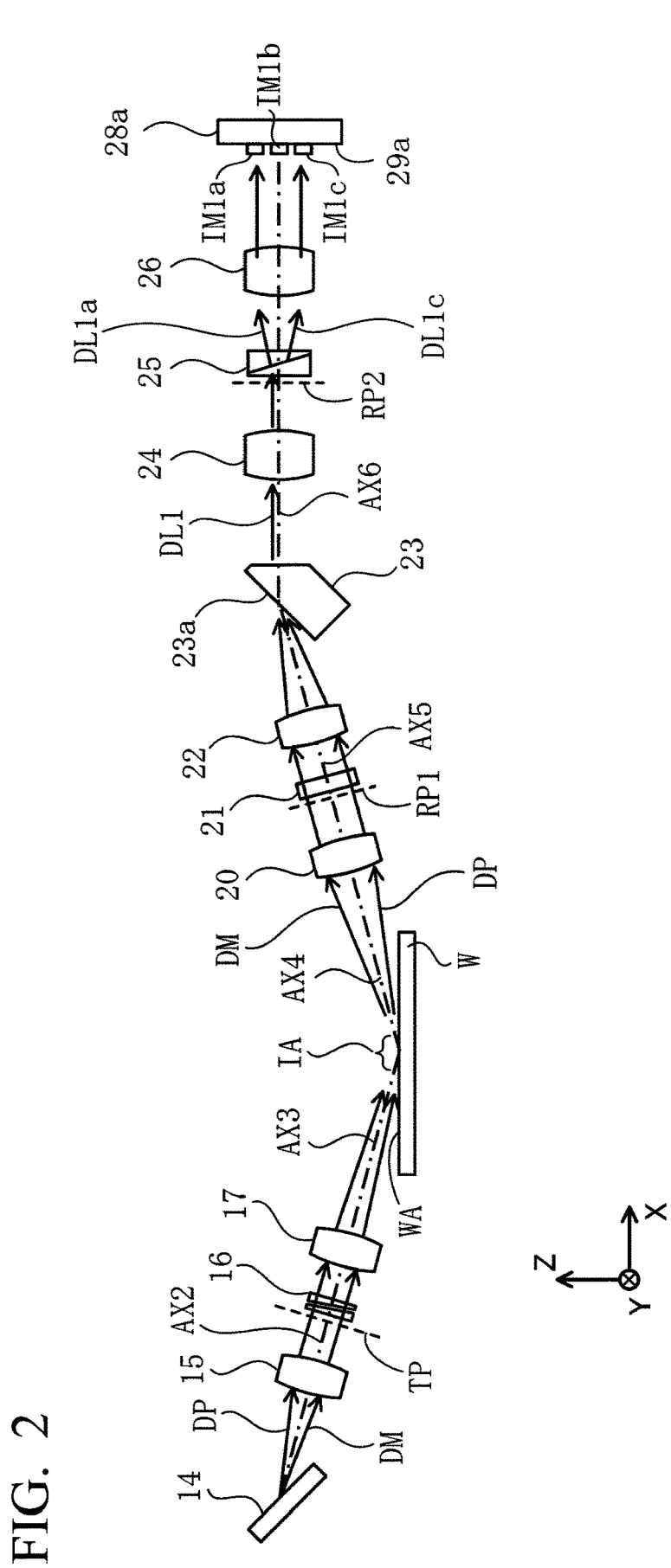
FIG. 2 is a side view of a configuration of a portion of the surface position detection device 100 when seen from a −Y direction.
Figure 3:
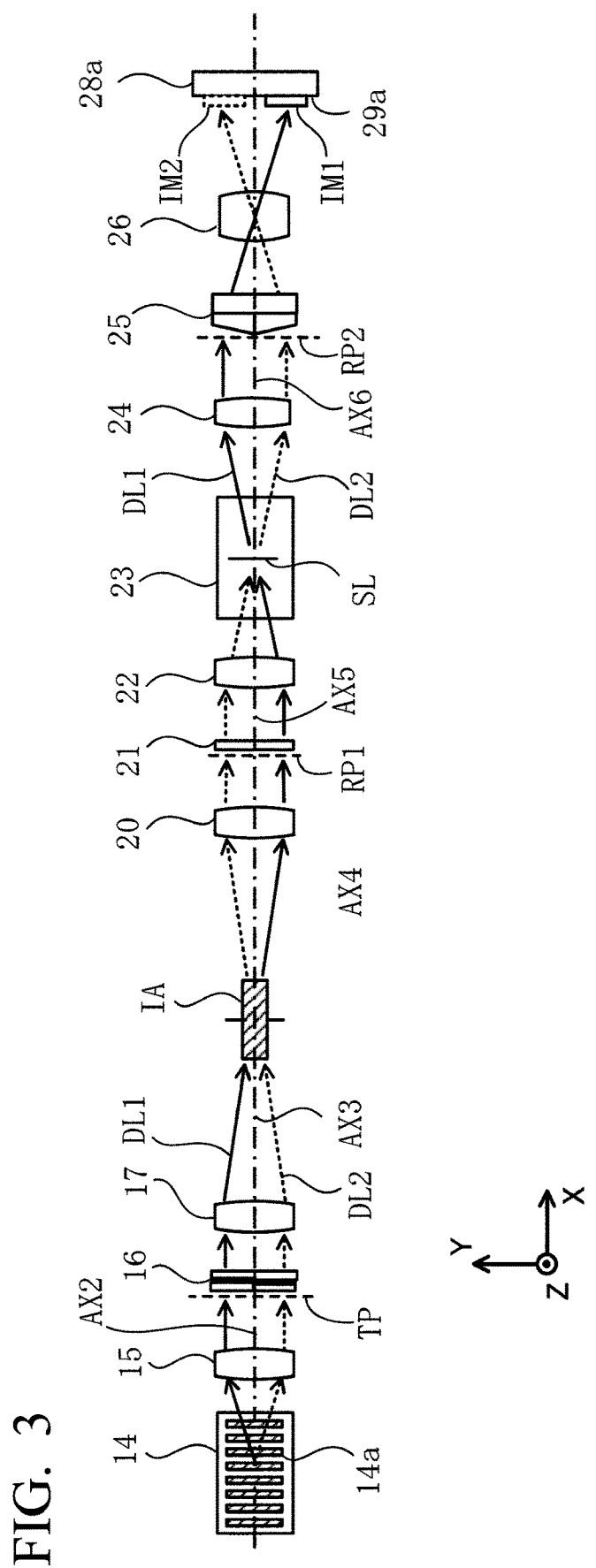
FIG. 3 is a top view of a configuration of a portion of the surface position detection device 100 when seen from a +Z direction.

In FIG. 1 to FIG. 3, only one lens of each lens group is shown in the drawings, but each lens group may be constituted of one or more lenses.

The measured object W is mounted on a stage ST, and the XYZ position of the stage ST is measured by an interferometer or an encoder (not shown).

In the present specification, all or part of the light introduction portion 12, the condenser lens group 13, the diffraction grating plate 14, the light transmission-side second lens group 15, a detection light division member 16, the light transmission-side first lens group 17, and the mirror 18 are also collectively referred to as a light transmission unit TS.

In the present specification, all or part of the mirror 19, the light reception-side first lens group 20, a cylindrical lens 21, the light reception-side second lens group 22, the light reception prism 23, the relay optical system (24, 26), a compound separation member 25, the polarization separation prism 27, and the light detection portions 28a and 28b are also collectively referred to as a light reception unit RS.

FIG. 2 and FIG. 3 are views schematically showing a configuration of a portion of the surface position detection device 100 shown in FIG. 1. FIG. 2 is a side view of a configuration from the condenser lens group 13 to the light detection portion 28a when seen from a −Y direction. In FIG. 2, an optical path from the diffraction grating plate 14 to the detected surface WA and an optical path from the detected surface WA to the light reception prism 23 are linearly deployed. FIG. 3 is a top view of a configuration from the condenser lens group 13 to the light detection portion 28a when seen from a +Z direction. In FIG. 2 and FIG. 3, the mirrors 18 and 19, the polarization separation prism 27, and the light detection portion 28b are omitted from the drawings. Further, in FIG. 2 and FIG. 3, an optical axis AX2 is matched with an optical axis AX3, an optical axis AX4 is matched with an optical axis AX5, and an optical axis AX6 is matched with the X-axis direction.

The light emitted from the light introduction portion 12 enters the condenser lens group 13 and enters the diffraction grating plate 14 substantially along an optical axis AX1 of the condenser lens group 13. A diffraction grating 14a constituted of a dielectric film or a metal film is formed on a surface of the diffraction grating plate 14. The diffraction grating 14a is, as an example, a one-dimensional grating in which a substantially rectangular pattern having a longitudinal direction matched with the Y direction in the drawing is aligned at a predetermined period in an in-plane direction of the diffraction grating plate 14 perpendicular to the Y direction. In the present example, the diffraction grating 14a is one that selectively generates +1st-order diffraction light DP and −1st-order diffraction light DM.

The ±1st-order diffraction lights DP and DM reflected and diffracted by the diffraction grating plate 14 enter the detection light division member 16 via the light transmission-side second lens 15. The detection light division member 16 is arranged on a pupil surface TP of a light transmission optical system constituted of the light transmission-side second lens group 15 and the light transmission-side first lens group 17. Here, the pupil surface TP is a plane on which a plurality of rays that enter different positions on the detected surface WA from the same direction are concentrated at approximately one point. Conversely, lights that travel in different directions from one point on the pupil surface TP enter different positions on the detected surface WA from the same direction. The optical axis AX2 is an optical axis of the light transmission-side second lens group 15 and the light transmission-side first lens group 17 and is matched with the optical axis AX1 of a condenser lens 13 reflected (mirrored) by the diffraction grating plate 14.

Figure 4:
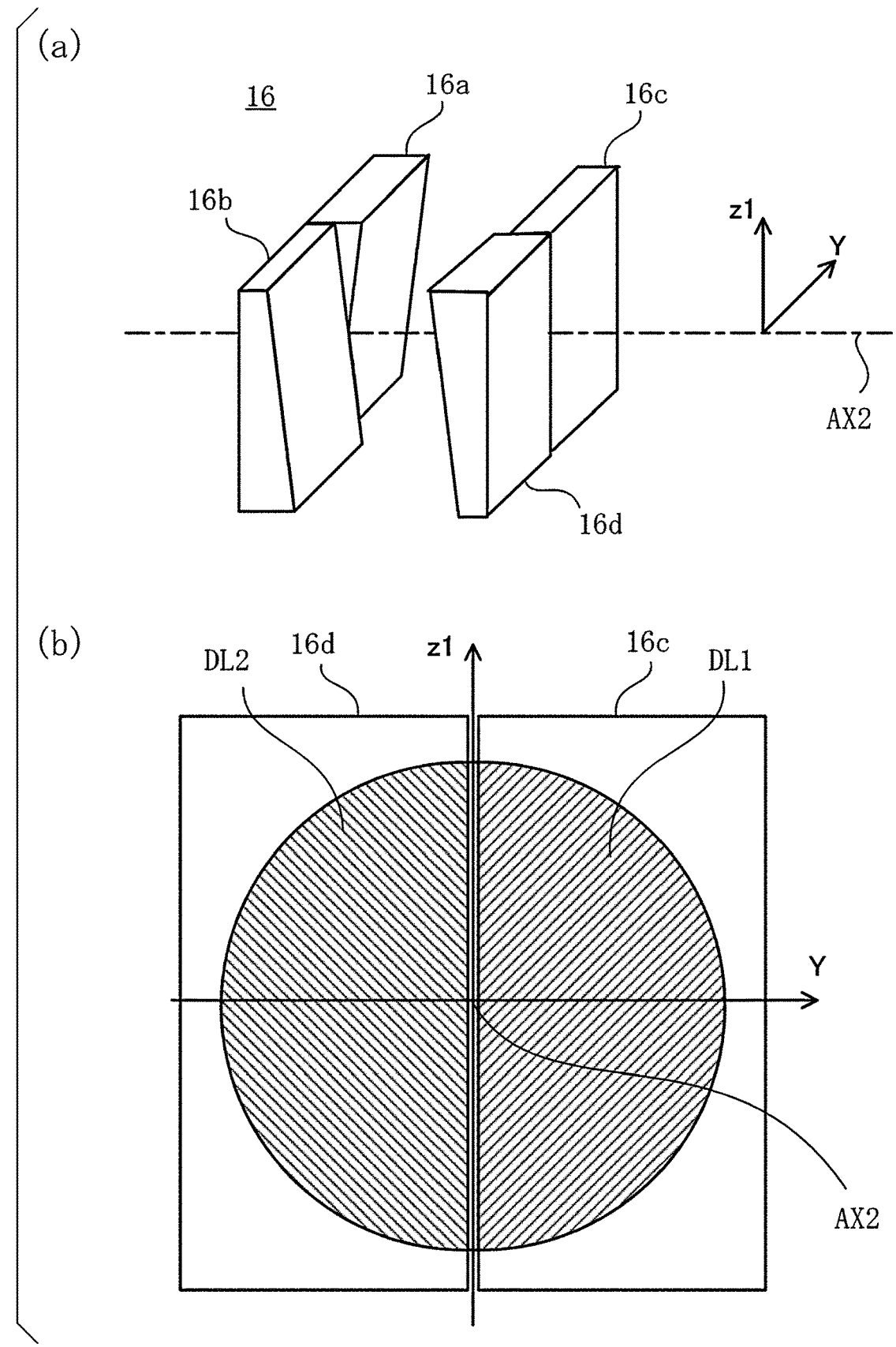
FIG. 4 is a view showing an example of a detection light division member.

FIG. 4 is a view showing an example of the detection light division member 16. FIG. 4 (a) is a perspective view showing the detection light division member 16, and FIG. 4 (b) is a view of the detection light division member 16 when seen from a light transmission-side first lens group 17 side. The optical axis AX2 and the Y-axis of FIG. 4 indicate the same direction as the optical axis AX2 and the Y-axis shown in FIG. 1 to FIG. 3. A z1-axis of FIG. 4 indicates a direction perpendicular to the optical axis AX2 and the Y-axis. The detection light division member 16 includes four prisms 16a to 16d as an example. The prism 16a and the prism 16b are arranged at substantially the same position in the optical axis AX2 direction to be in contact with each other in the Y direction. The prism 16c and the prism 16d are arranged at positions away from the prism 16a and the prism 16b toward the downstream side of the optical path in the optical axis AX2 direction to be in contact with each other in the Y direction. A boundary between the prism 16a and the prism 16b and a boundary between the prism 16c and the prism 16d are on a plane that passes through the optical axis AX2 and is parallel to the z1 axis.

Any one of the four prisms 16a to 16d has a thickness in the optical axis AX2 direction that is changed in accordance with the position in the z1 direction, provides the light transmitting therethrough with a phase difference that is changed in accordance with the position in the z1 direction, and deflects the proceeding direction of the light transmitting therethrough by a minute angle in the z1 direction.

The prisms 16a and 16b, and the prisms 16c and 16d may not be two separate prisms, and may be a prism in which the shape of an incident surface or an emission surface of an integrated prism is different between a +Y side and a −Y side of the optical axis AX2.

The +1st-order diffraction light DP and the −1st-order diffraction light DM that enter the detection light division member 16 are divided at the pupil surface TP into first detection light DL1 that is emitted from the prism 16c arranged on a further +Y side than the optical axis AX2 and second detection light DL2 that is emitted from the prism 16d arranged on a further −Y side than the optical axis AX2, respectively. Then, the first detection light DL1 and the second detection light DL2 are deflected from each other by a minute angle in the z1 direction.

It should be noted that both of the +1st-order diffraction light DP and the −1st-order diffraction light DM are included in each of the first detection light DL1 and the second detection light DL2.

Further, a diffraction light selection filter that selectively transmits only the +1st-order diffraction light DP and the −1st-order diffraction light DM may be provided on one side or the other side in the optical axis AX2 direction of the detection light division member 16. In this case, a diffraction grating that generates diffraction light other than the +1st-order diffraction light DP and the −1st-order diffraction light DM may be used as the diffraction grating 14a.

The first detection light DL1 and the second detection light DL2 are focused by the light transmission-side first lens group 17, then are reflected by the mirror 18, are radiated on the detected surface WA, and form an irradiation region IA on the detected surface WA. The first detection light DL1 and the second detection light DL2 are lights passing through a position that is displaced in the Y direction with respect to each other in the pupil surface TP. Accordingly, as shown in FIG. 3, an incident direction of the first detection light DL1 and the second detection light DL2 to the detected surface WA is a direction almost parallel to the +X direction but is displaced in the Y direction with respect to each other.

An incident angle θ (an angle of incident light with respect to a normal line NV of the detected surface WA) of the detection light to the detected surface WA is set to, for example, a large angle equal to or more than 80 degrees and less than 90 degrees. The optical axis AX3 is a reflected (mirrored) axis of the optical axis AX2 by the mirror 18. The incident angle θ may be less than 80 degrees.

Figure 5:
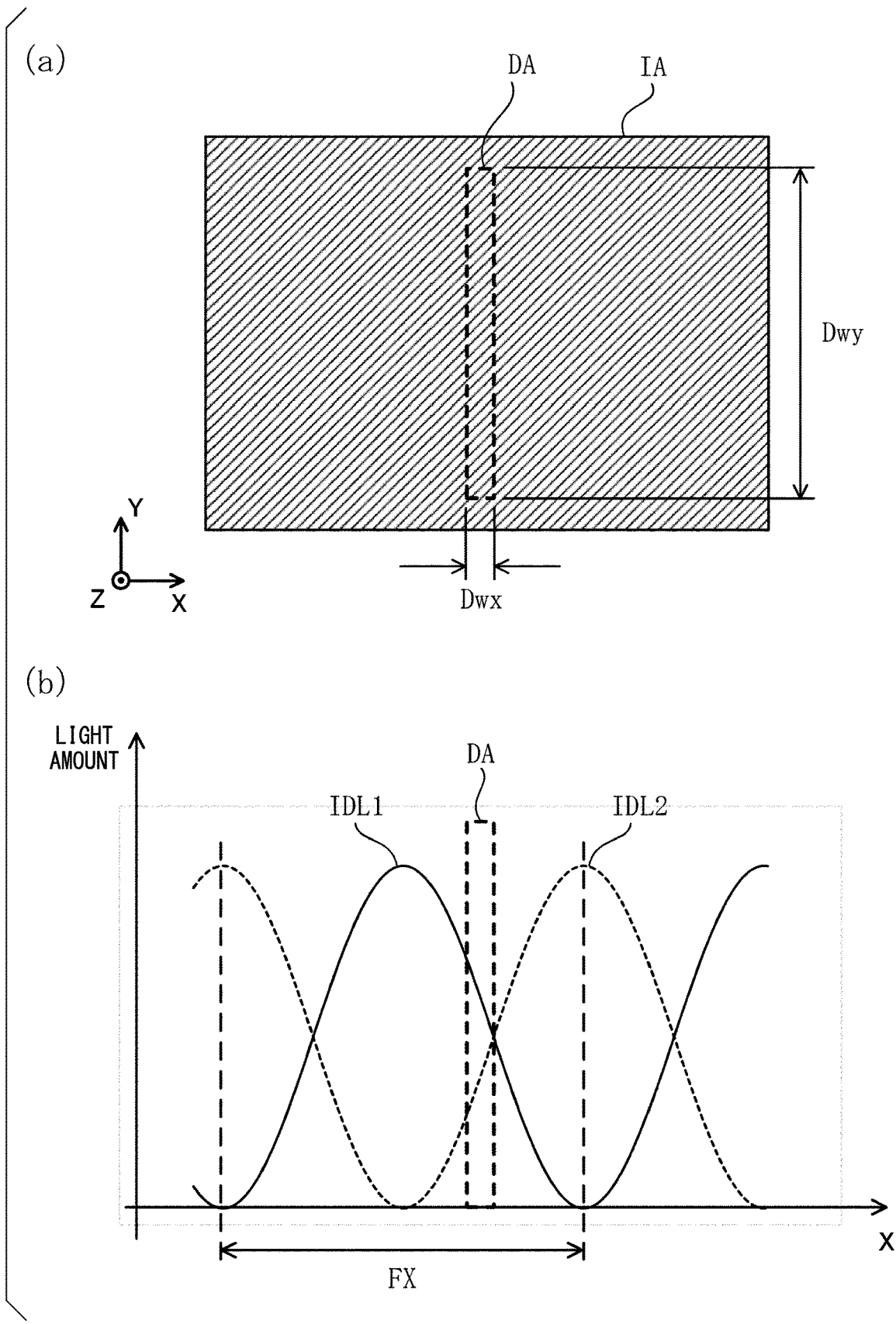
FIG. 5 (a) is a view showing an irradiation region IA on a detected surface WA, and FIG. 5 (b) is a view showing a light amount distribution in an X-axis direction of the irradiation region IA.

FIG. 5 (a) is a view showing the irradiation region IA on the detected surface WA, and FIG. 5 (b) is a view showing a light amount distribution in the X-axis direction of the irradiation region IA. A solid line represents a light amount distribution IDL1 of the first detection light DL1, and a dashed line represents a light amount distribution IDL2 of the second detection light DL2. A detection region DA shown in FIG. 5 will be described later.

Since each of the first detection light DL1 and the second detection light DL2 is constituted of two diffraction lights which are the +1st-order diffraction light DP and the −1st-order diffraction light DM, both of the light amount distribution IDL1 and the light amount distribution IDL2 form an interference fringe formed of two diffraction lights. Accordingly, as shown in FIG. 5 (b), both the light amount distribution IDL1 and the light amount distribution IDL2 define a distribution in which the intensity is modulated by a sinusoidal function (sine function) having an amplitude and a predetermined period FX in the X direction. In the present example, the period FX in the X direction and the amplitude of the sinusoidal function that modulates the light amount distribution IDL1 are equal to those that modulate the light amount distribution IDL2.

The first detection light DL1 and the second detection light DL2 are deflected by a minute angle by the detection light division member 16 as described above. According to this deflection, the phase of the sinusoidal functions of the light amount distribution IDL1 and the light amount distribution ID are displaced by half of the period FX of the sinusoidal function of each intensity modulation. However, since the deflection amount is small, the first detection light DL1 and the second detection light DL2 are superimposed, that is, are almost overlapped with each other and are radiated onto the irradiation region IA on the detected surface WA.

In other words, the first detection light DL1 and the second detection light DL2 are radiated and superimposed onto the detected surface WA obliquely from a direction having a direction component in the +X direction and form the irradiation region IA on the detected surface WA.

Accordingly, in the irradiation region IA, at an arbitrary position in the X-axis direction, the sum of the light amount of the first detection light DL1 and the light amount of the second detection light DL2 is constant. In other words, the light amount distribution IDL1 and the light amount distribution IDL2 are complementary with respect to the X direction.

In addition, both the light amount distribution IDL1 and the light amount distribution IDL2 are constant within a predetermined range in the Y direction.

The X direction within the plane of the detected surface WA may be interpreted as a first direction. The Y direction within the plane of the detected surface WA may be interpreted as a second direction.

The reason for arranging the detection light division member 16 on the pupil plane TP is to divide the ±1st-order diffraction lights DP and DM into the first detection light DL1 and the second detection light DL2 in accordance with the incident direction to the detected surface WA regardless of the incident position to the detected surface WA. Accordingly, the position of the pupil surface TP at which the detection light division member 16 is arranged may not necessarily be a plane in which a plurality of rays incident from the same direction to different positions on the detected surface WA are collected at exactly one point. That is, the position may be a position that is shifted frontward or rearward to a certain degree along the optical axis AX2 as long as the lights can be divided into the first detection light DL1 and the second detection light DL2 in accordance with the incident direction to the detected surface WA. This also applies to another pupil surface which will be described later.

The light reflected by the detected surface WA of the measured object W enters the incident surface 23a of the light reception prism 23 via the mirror 19, the light reception-side first lens group 20, the cylindrical lens 21, and the light reception-side second lens group 22. The optical axis AX5 is an optical axis of the light reception-side first lens 20 and the light reception-side second lens 22. The optical axis AX4 is a reflected (mirrored) axis of the optical axis AX5 by the mirror 19.

The mirror 19, the light reception-side first lens group 20, and the light reception-side second lens group 22 are arranged at a symmetrical position and each has a symmetrical configuration to the mirror 18, the light transmission-side first lens group 17, and the light transmission-side second lens group 15, respectively, with respect to a YZ plane that includes a center of the irradiation region IA.

The incident surface 23a of the light reception prism 23 is arranged at a symmetrical position to the diffraction grating 14a on the diffraction grating plate 14 with respect to the YZ plane that includes the center of the irradiation region IA.

Figure 6:
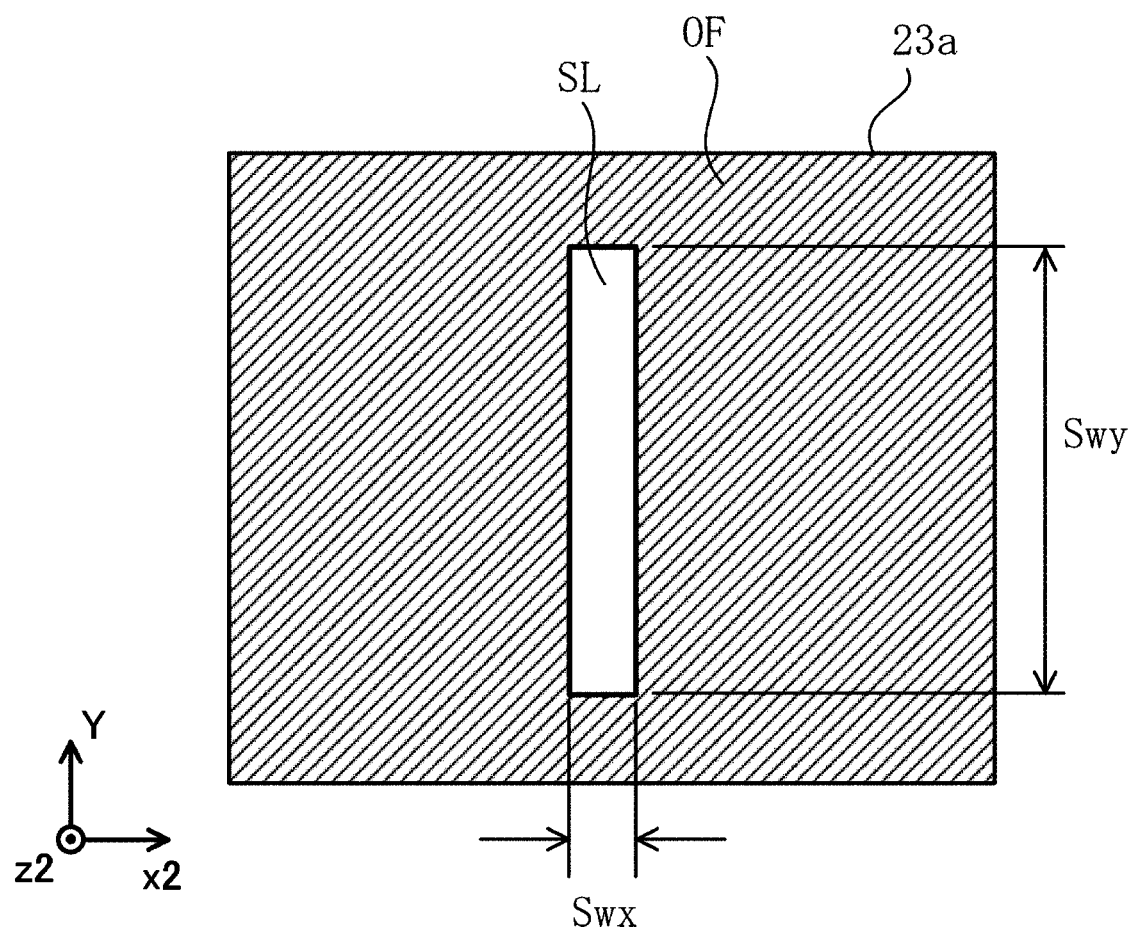

FIG. 6 is a view of the incident surface 23a of the light reception prism 23 when seen from a normal direction with respect to the incident surface 23a. An opening portion (slit) SL that is a light transmission portion having a longitudinal direction in the Y direction is formed at an intersection point of the optical axis AX2 with the incident surface 23a or in the vicinity of the intersection point. A light-shielding portion OF that is covered by a light shield film is formed at a part other than the opening portion SL of the incident surface 23a.

The incident surface 23a is optically conjugated with the detected surface WA of the measured object W via the mirror 19, the light reception-side first lens group 20, and the light reception-side second lens group 22. That is, both the first detection light DL1 and the second detection light DL2 emitted from one point in the detected surface WA are focused to one point on the incident surface 23a. An x2 axis that is an in-plane direction of the incident surface 23a is in an imaging relationship with the X-axis in the detected surface WA. That is, an arbitrary region along the X direction in the detected surface WA is imaged in a region along the x2 direction in the incident surface 23a. The z2 axis is an axis in a direction perpendicular to the Y axis and the x2 axis.

The opening portion SL selectively transmits only light of the first detection light DL1 and the second detection light DL2 that is reflected by a portion having an imaging relationship with the opening portion SL in the irradiation region IA on the detected surface WA formed on the incident surface 23a. Accordingly, the portion of the irradiation region IA on the detected surface WA having an imaging relationship with the opening portion SL on the incident surface 23a via the light reception-side first lens 20, the light reception-side second lens 22, and the like may be interpreted as the detection region DA as shown in FIG. 5 (a) and FIG. 5 (b). That is, only the light reflected by the detection region DA on the detected surface WA of the first detection light DL1 and the second detection light DL2 transmits the opening portion SL.

The width in the x2 direction of the opening portion SL is a width Swx, the width in the Y direction is a width Swy, the width in the X direction of the detection region DA on the detected surface WA is a width Dwx, and the width in the Y direction is a width Dwy as shown in FIG. 5 (a). An imaging magnification ratio from the detected surface WA to the incident surface 23a by the light reception-side first lens 20 and the light reception-side second lens 22 is matched with a ratio of the width Swx to the width Dwx and a ratio of the width Swy to the width Dwy.

In order to focus the reflection light from the large detection region DA having the width Dwx on the narrow opening portion SL having the width Swx, the cylindrical lens 21 may be provided on a pupil surface RP1 of the optical system constituted of the light reception-side first lens group 20 and the light reception-side second lens group 22 or in the vicinity of the pupil surface RP1. Here, the pupil surface RP1 is a plane on which a plurality of rays that are emitted from different positions on the detected surface WA in the same direction are concentrated at approximately one point.

The light reception-side first lens group 20 and the light reception-side second lens group 22 may be interpreted as a first light reception optical system.

The x2 direction in the incident surface 23a may be interpreted as a third direction. The Y direction in the incident surface 23a may be interpreted as a fourth direction.

A pupil surface RP1 may be interpreted as a first pupil surface.

The first detection light DL1 and the second detection light DL2 that have transmitted through the opening portion SL are deflected by a predetermined angle by a refraction action of the light reception prism 23, are then emitted from the light reception prism 23, and enter the front-side lens group 24 of the relay optical system (24, 26). The optical axis AX6 is an optical axis of the front-side lens group 24 and the rear-side lens group 26 of the relay optical system.

Since the first detection light DL1 and the second detection light DL2 are diffracted when transmitting through the opening portion SL having a relatively narrow width Swx in the X2 direction, and the proceeding direction extends in the Z direction, it becomes impossible to distinguish between the +1st-order diffraction light DP and the −1st-order diffraction light DM. Accordingly, in FIG. 2, the light after transmitting through the opening portion SL is shown as the first detection light DL1. Further, in FIG. 2 seen from the −Y direction, the second detection light DL2 is displayed to overlap the first detection light DL1 and is therefore not shown.

A compound separation member 25 is arranged on a pupil surface RP2 by the front-side lens group 24 with respect to the incident surface 23a. Here, the pupil surface RP2 is a plane on which a plurality of rays that are emitted from different positions on the incident surface 23a in the same direction are concentrated at approximately one point. The details of the compound separation member 25 will be described later.

The first detection light DL1 and the second detection light DL2 that are emitted from the compound separation member 25 enter the polarization separation prism 27 via the rear-side lens group 26 of the relay optical system. A P-polarization component of the first detection light DL1 and the second detection light DL2 proceeds straight through the polarization separation prism 27 and forms an image of the P-polarization component of the opening portion SL on the light reception surface 29a on the light detection portion 28a. On the other hand, an S-polarization component of the first detection light DL1 and the second detection light DL2 is reflected by the polarization separation prism 27 and forms an image of the S-polarization component of the opening portion SL on the light reception surface 29b on the light detection portion 28b.

The opening portion SL is formed on the incident surface 23a of the light reception prism 23 that is greatly inclined from a plane perpendicular to the optical axis AX6. However, as shown in FIG. 2, an optical path length inside the light reception prism 23 is changed with respect to the Z direction, and thereby, the inclination of the image surface is corrected. As a result, the image of the opening portion SL is formed to coincide with the light reception surface 29a arranged perpendicular to the optical axis AX6. That is, the light reception prism 23 may be interpreted as an image surface inclination correction member.

A rotation direction about the optical axis AX6 of the polarization separation prism 27 is set such that the P polarization and the S polarization with respect to the polarization separation surface 27a of the polarization separation prism 27 are matched with the P polarization and the S polarization with respect to the detected surface WA.

A photoelectric conversion signal of the detection light that is received by the light reception surfaces 29a and 29b of the light detection portions 28a and 28b and is photoelectrically converted is output from the light detection portions 28a and 28b and is input to a calculation unit PU. The calculation unit PU may be a computer device that includes a CPU and a memory.

The details of an image of the opening portion SL formed on the light detection portions 28a and 28b and the light reception surfaces 29a and 29b thereof will be described later.

Figure 7:
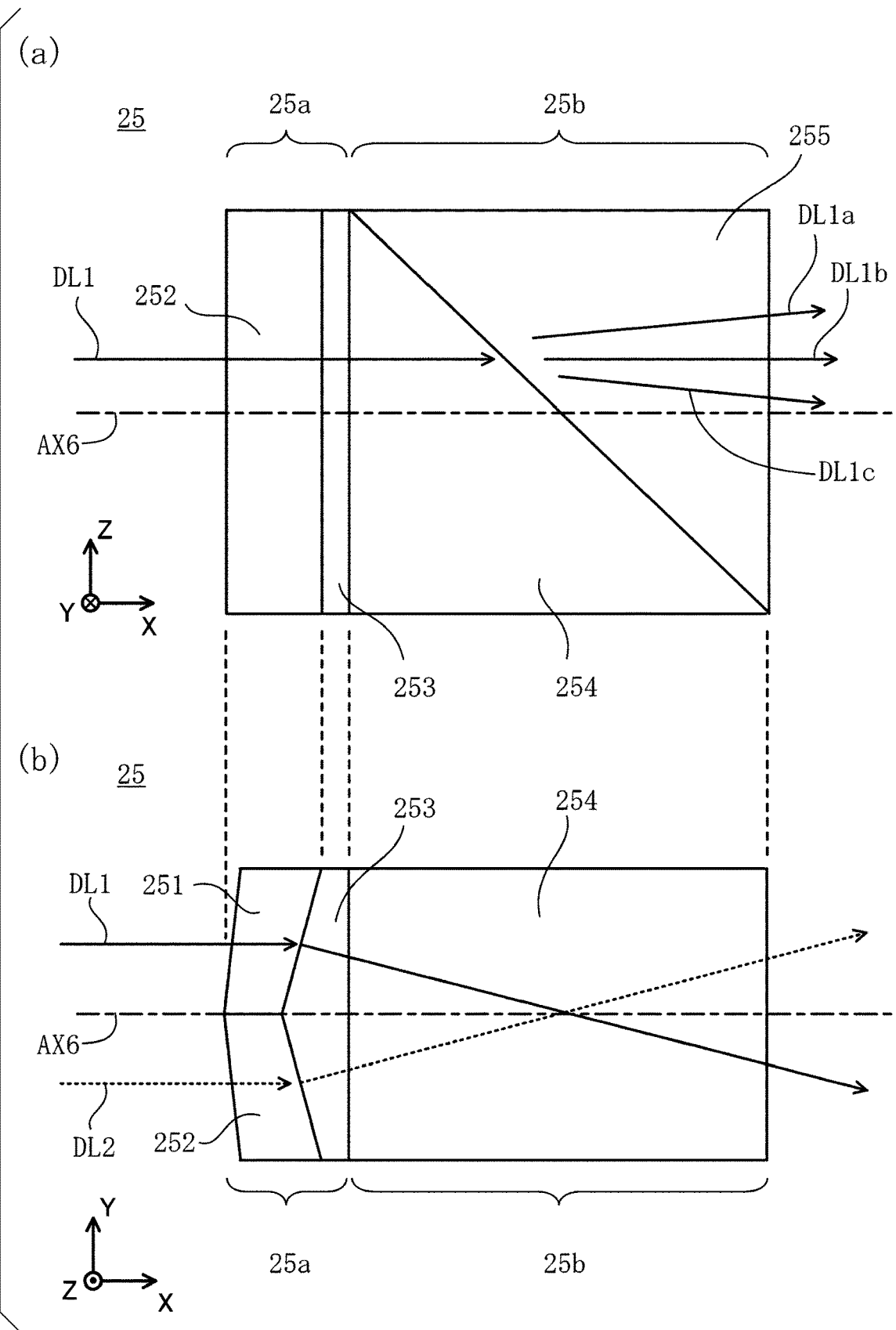
FIG. 7 is a view showing an example of a compound separation member 25.

FIG. 7 is a view showing an example of the compound separation member 25. In FIG. 7, for ease of understanding, the optical axis AX6 is represented to be parallel to the X-axis in the same manner as shown in FIG. 2 and FIG. 3. FIG. 7 (a) shows a cross-sectional view in an XZ plane passing through the optical axis AX6 of the compound separation member 25, and FIG. 7 (b) shows a cross-sectional view in an XY plane passing through the optical axis AX6 of the compound separation member 25.

The compound separation member 25 is functionally divided along the optical axis AX6 into a light separation member 25a on the incident side and a spectroscopic member 25b on the emission side.

A first block 251 arranged on the +Y side of the optical axis AX6 and a second block 252 arranged on the −Y side of the optical axis AX6 are arranged on an incident side of the light separation member 25a. Incident surfaces of the first block 251 and the second block 252 are surfaces that are each rotated in different directions about a rotation axis parallel to the Z-axis with respect to a surface perpendicular to the optical axis AX6. Emission surfaces of the first block 251 and the second block 252 are similar to the incident surfaces of the first block 251 and the second block 252. The shape of an incident surface of a third block 253 is matched with the shape of the emission surfaces of the first block 251 and the second block 252. The emission surface of the third block 253 is a plane perpendicular to the optical axis AX6.

As a result, the light separation member 25a refracts (deflects) light that enters a further +Y side than the optical axis AX6 and light that enters a further −Y side than the optical axis AX in different directions. It is preferable that the first block 251 and the second block 252 be formed of a material having a refractive index different from that of a material forming the third block 253.

Since the compound separation member 25 is arranged on the pupil surface RP2, as shown in FIG. 3, the light that enters the further +Y side than the optical axis AX6 is the first detection light DL1, and the light that enters the further −Y side than the optical axis AX6 is the second detection light DL2. Then, the lights that are deflected from each other by a minute angle in the Y direction on the pupil surface RP2 are formed at positions that are shifted from each other in the Y direction on the light reception surfaces 29a and 29b.

The spectroscopic member 25b on the emission side is a prism in which a fourth block 254 and a fifth block 255 that are two triangular prisms are arranged such that oblique sides thereof face each other. An incident surface of the fourth block 254 is matched with the emission surface of the third block 253, and an emission surface of the fifth block 255 is matched with a plane perpendicular to the optical axis AX6. An interface plane between the fourth block 254 and the fifth block 255 is a plane that includes a Y-axis direction. The fourth block 254 and the fifth block 255 are formed of a material having a different dispersion.

Therefore, at the interface plane between the fourth block 254 and the fifth block 255, the lights having different wavelengths from each other included in the first detection light DL1 and the second detection light DL2 are each refracted at different angles depending on the wavelength. As a result, the first detection light DL1 and the second detection light DL2 are dispersed by the spectroscopic member 25b, become detection lights DL1a to DL1c that are deflected by a minute angle in the Z direction from one another for each wavelength, and are emitted from the spectroscopic member 25b.

The spectroscopic member 25b may be formed of one prism having a different refractive power depending on the wavelength.

Since the compound separation member 25 is arranged on the pupil surface RP2, the lights that are deflected by a minute angle in the Z-direction from each other by the compound separation member 25 are formed on the light reception surfaces 29a and 29b at positions that are shifted in the Z-direction from each other.

In FIG. 7, for ease of understanding, the second detection light DL2 and detection lights DL2a to DL2c obtained by dispersing the second detection light DL2 are not shown.

Figure 8:
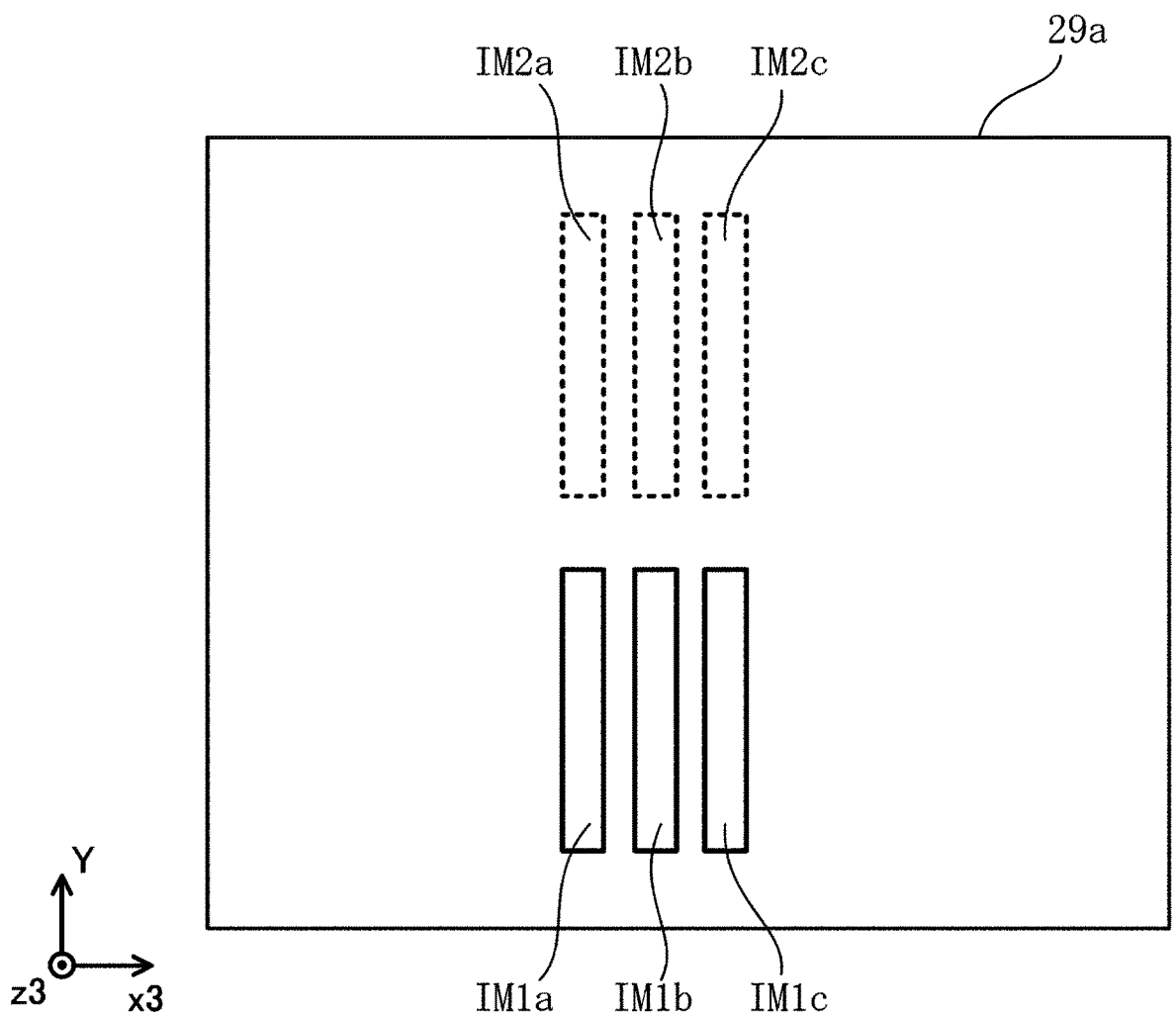

FIG. 8 is a view showing an image of a P-polarization component of the opening portion SL formed on the light reception surface 29a. In FIG. 8, an x3 axis in an in-plane direction of the light reception surface 29a is in an imaging relationship with the x2 axis in the incident surface 23a described above. That is, an arbitrary region along the x2 direction of the incident surface 23a is imaged in a region along the x3 direction in the light reception surface 29a.

As described above, the x2 axis which is the in-plane direction of the incident surface 23a is in an imaging relationship with the X axis in the detected surface WA. Accordingly, the x3 axis in the in-plane direction of the light reception surface 29a is also in an imaging relationship with the X axis in the detected surface WA. The z3 axis is an axis in a direction perpendicular to the Y axis and the x3 axis.

It should be noted that FIG. 2 in which the optical path is shown to be linearly deployed is described such that the x3 axis in the in-plane direction of the light reception surface 29a is matched with the Z axis conveniently.

The relay optical system constituted of the front-side lens group 24 and the rear-side lens group 26 may be interpreted as a second light reception optical system.

The x2 direction in the incident surface 23a may be interpreted as a third direction. The Y direction in the incident surface 23a may be interpreted as a fourth direction.

The pupil surface RP2 may be interpreted as a second pupil surface.

The x3 direction in the light reception surface 29a may be interpreted as a fifth direction. The Y direction in the light reception surface 29a may be interpreted as a sixth direction.

Since according to the separation and the deflection of the detection light by the compound separation member 25, different wavelength components of each of the first detection light DL1 and the second detection light DL2 are guided to different positions on the light reception surface 29a, a plurality of images (IM1a to IM1c and IM2a to IM2c) of the opening portion SL are formed on the light reception surface 29a.

The images IM1a to IM1c and the images IM2a to IM2c that are formed to be away from each other in the Y direction on the light reception surface 29a are images formed by the first detection light DL1 and the second detection light DL2 deflected by a minute angle in the Y direction from each other by the light separation member 25a of the compound separation member 25, respectively. The first detection light DL1 and the second detection light DL2 are dispersed by the spectroscopic member 25b into detection lights DL1a to DL1c and detection lights DL2a to DL2c, respectively, that are deflected by a minute angle in a direction perpendicular to the Y direction from each other for each wavelength. Accordingly, images of the opening portion SL that are formed on the light reception surface 29a are also formed at different positions in the x3 direction depending on the wavelength.

The image IM1a is an image by light having a first wavelength of the first detection light DL1, the image IM1b is an image by light having a second wavelength of the first detection light DL1, and the image IM1c is an image by light having a third wavelength of the first detection light DL1.

On the other hand, the image IM2a is an image by light having a first wavelength of the second detection light DL2, the image IM2b is an image by light having a second wavelength of the second detection light DL2, and the image IM2c is an image by light having a third wavelength of the second detection light DL2.

In FIG. 8, for ease of understanding, the first detection light DL1 and the second detection light DL2 include lights of three different wavelengths. Accordingly, the number of images IM1a to IM1c by the first detection light DL1 is three, and the number of images IMIM2a to IM2c by the second detection light DL2 is three.

However, the wavelengths of lights included in the first detection light DL1 and the second detection light DL2 are not limited to three discrete wavelengths and may be four or more discrete different wavelengths. In this case, the number of images IM1a to IM1c by the first detection light DL1 and the number of images IMIM2a to IM2c by the second detection light DL2 are equal to or more than four.

Further, the wavelengths of lights included in the first detection light DL1 and the second detection light DL2 are not limited to a plurality of discrete wavelengths and may be a plurality of discrete or continuous wavelength bands.

The light reception surface 29a photoelectrically converts and outputs each of light amounts of these images IM1a to IM1c and IM1M2a to IM2c. As an example, a plurality of separate photoelectric conversion units are provided on the light reception surface 29a, the photoelectric conversion units each including each of the images IM1a to IM1c and IMIM2a to IM2c. Each photoelectric conversion unit receives each of the images IM1a to IM1c and IMIM2a to IM2c and photoelectrically converts and outputs the light amount.

As the light detection portion 28a, a two-dimensional image sensor in which microscopic light reception pixels are two-dimensionally aligned on the light reception surface 29a may be used. In this case, for example, one image IM1a is received by a plurality of light reception pixels. In this case, the light detection portion 28a outputs a signal obtained by photoelectric conversion of each light amount of the detection light received by the plurality of light reception pixels as a photoelectric conversion signal.

When the two-dimensional image sensor is used as the light detection portion 28a, since the resolution in the x3 direction of the light reception surface 29a is improved, the first detection light DL1 and the second detection light DL2 can be dispersed with higher accuracy and received. Thereby, light having a continuous spectrum can be used as the first detection light DL1 and the second detection light DL2.

By narrowing the width in the x3 direction of each of the plurality of images IM1a to IM1c and IMIM2a to IM2c on the light reception surfaces 29a and 29b compared to the width in the Y direction, the first detection light DL1 and the second detection light DL2 can be dispersed with further high accuracy and received.

Since the light detection portion 28b has a configuration similar to that of the light detection portion 28a described above, the description thereof is omitted.

Further, since the image of the S polarization component of the opening portion SL formed on the light reception surface 29b is similar to the image of the P polarization component of the opening portion SL formed on the light reception surface 29a described above, the description thereof is omitted.

Hereinafter, a measurement principle in the surface position detection device 100 of the first embodiment is described. As described above, the light amount distribution IDL1 and the light amount distribution IDL2 shown in FIG. 5 (b) are formed on the detected surface WA by the irradiation of the first detection light DL1 and the second detection light DL2, respectively. Both of the first detection light DL1 and the second detection light DL2 are incident from a direction inclined by an incident angle θ in the −X direction relative to the normal line NV of the detected surface WA. Accordingly, when the detected surface WA moves upward or downward in the Z direction of FIG. 1, the light amount distribution IDL1 and the light amount distribution IDL2 are shifted in the X direction as a whole while maintaining the distribution shape of the light amount distribution IDL1 and the light amount distribution IDL2. When the detected surface WA moves in the +Z direction, the light amount distribution IDL1 and the light amount distribution IDL2 are shifted in the −X direction.

On the other hand, the detection region DA shown in FIG. 5 (b) is a region indicating that the first detection light DL1 and the second detection light DL2 reflected by the detection region DA transmit through the opening portion SL on the incident surface 23a of the light reception prism 23. That is, the detection region DA is in an imaging relationship with the opening portion SL via the light reception-side first lens 20, the light reception-side second lens 22, and the like. However, since the optical axis AX5 of the light reception-side first lens 20 is inclined in the +X direction relative to the normal line NV of the detected surface WA, when the detected surface WA moves upward or downward in the Z direction of FIG. 1, the position of the detection region DA is also shifted in the X direction on the detected surface WA. When the detected surface WA moves in the +Z direction, the detection region DA is shifted in the +X direction. That is, in accordance with the movement of the detected surface WA in the Z direction, the positional relationship in the X direction between the light amount distribution IDL1 and the light amount distribution IDL2 shown in FIG. 5 (b) and the detection region DA is changed.

The light amount of each image IM1a to IM1c of the opening portion SL by the first detection light DL1 on the light reception surface 29a is proportional to the sum of the light amount of the first detection light DL1 in the detection region DA. Further, the light amount of each image IM2a to IM2c of the opening portion SL by the second detection light DL2 on the light reception surface 29a is proportional to the sum of the light amount of the second detection light DL2 in the detection region DA. Accordingly, the light amount of each image IM1a to IM1c and IM2a to IM2c is varied in accordance with the variation of position in the Z direction of the detected surface WA.

It should be noted that, unlike most conventional surface position detection devices, even when the position in the Z direction of the detected surface WA is varied, the position of each image IM1a to IM1c and IM2a to IM2c on the light reception surface 29a is not varied.

Figure 9:
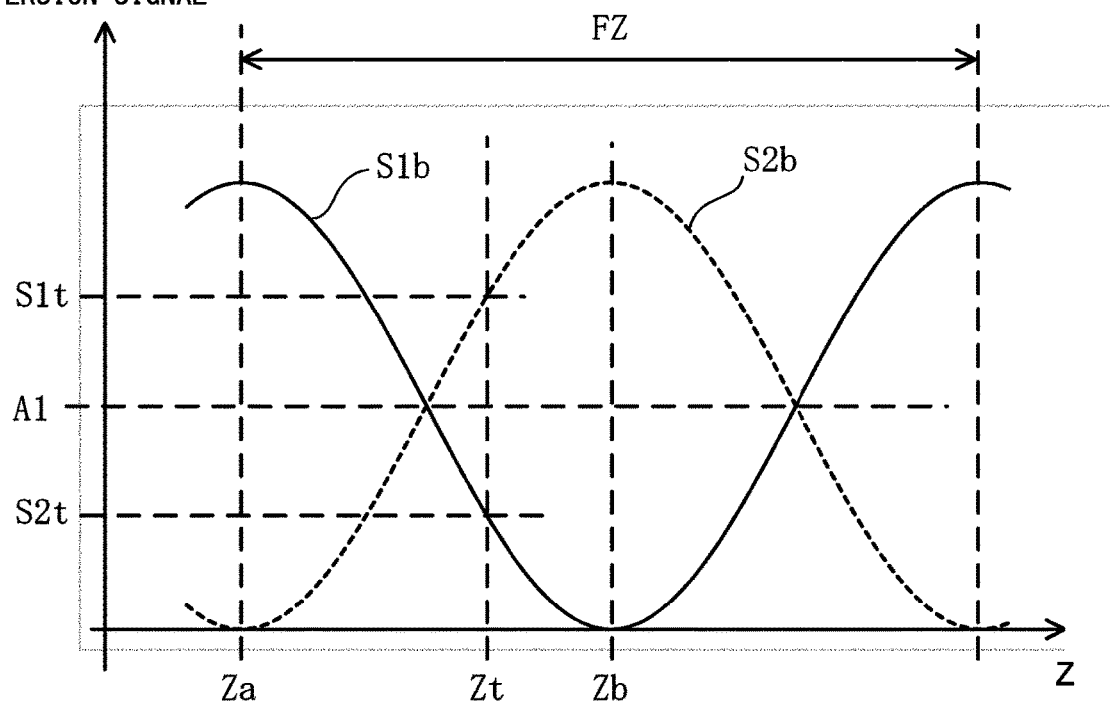
FIG. 9 is a view showing an example of a relationship between a position (horizontal axis) in a Z-axis direction of the detected surface WA, and a photoelectric conversion signal S1b and a photoelectric conversion signal S2b.

FIG. 9 is a view showing, as an example, a relationship between a position (horizontal axis) in a Z-axis direction of the detected surface WA, and a photoelectric conversion signal S1b of the image IM1b by a second wavelength component of the first detection light DL1 and a photoelectric conversion signal S2b of the image IM2b by a second wavelength component of the second detection light DL2. As described above, the first detection light DL1 and the second detection light DL2 have the light amount distributions IDL1 and IDL2, respectively, of sinusoidal functions having an equal period FX and an equal amplitude and having a displaced phase by half of the period FX on the detected surface WA. Therefore, both of the photoelectric conversion signal S1b and the photoelectric conversion signal S2b become signals represented by the following Expression (1) and Expression (2), respectively, in which, with respect to the position in the Z-axis direction of the detected surface WA, the periods FZ are equal to each other, the amplitudes A1 are equal to each other, and the phases are displaced by half of the period FZ from each other.

$$S1b = A1 + A1 \times \cos\{2\pi(Z-Za)/FZ\} \quad (1)$$

$$S2b = A1 - A1 \times \cos\{2\pi(Z-Za)/FZ\} \quad (2)$$

The Za is a Z position of the detected surface WA where the photoelectric conversion signal S1b is maximized, and the photoelectric conversion signal S2b is minimized. The Zb shown in FIG. 9 is a Z position of detected surface WA which is located a position adjacent to the Za on the +Z side of the Za and at which the photoelectric conversion signal S1b is minimized, and the photoelectric conversion signal S2b is maximized.

The calculation unit PU calculates a Z position Zt of the detected surface WA which is located at an arbitrary position between the Za and the Zb by a calculation based on Expression (3) and Expression (4) from a value S1t of the photoelectric conversion signal S1b and a value S2t of the photoelectric conversion signal S2b.

$$Zt = Za + FZ \times \cos-1\{(S2t-S1t)/(2 \times A1)\}/2\pi \quad (3)$$

$$A1 = (S2t + S1t)/2 \quad (4)$$

The cos−1 is an inverse cosine function.

When the width Dwx in the X direction of the detection region DA is shorter than half of the period FX in the X direction of the light amount distribution IDL1 and the light amount distribution IDL2, the variation of the photoelectric conversion signal S1b and the photoelectric conversion signal S2b can be increased when the detected surface WA is varied in the Z direction. As a result, it is possible to further improve the detection accuracy.

In the conventional surface position detection device, by obliquely radiating detection light on the detected surface, forming an irradiation region having a predetermined width in the X direction, and detecting a position of the center of gravity of the light amount in the X direction of the irradiation region, the Z position of the detected surface is detected. Accordingly, when there is a change in a reflectance in the X direction inside the irradiation region of the detected surface, since the position of the center of gravity of the light amount of the irradiation region is changed by the change in the reflectance, a detection error occurs.

For example, in a case of a semiconductor wafer in a formation process of an integrated circuit, the reflectance differs depending on a position of a surface of the wafer depending on an internal structure and the like. Accordingly, it is difficult to accurately detect a surface position of a semiconductor wafer surface in a conventional surface position detection device.

On the other hand, in the surface position detection device of the first embodiment, the detected Z position Zt of the detected surface WA is hardly affected by the change in the reflectance of the detection region DA. When the reflectance of the detection region DA is changed, both of the photoelectric conversion signal S1$b$ and the photoelectric conversion signal S2$b$ are increased and decreased with an equal proportionality coefficient in response to the change in the reflectance of the detection region DA. This is because even when (S2$t$−S1$t$) in Expression (3) becomes α-fold due to the change in the reflectance of the detection region DA, since the A1 in Expression (3), that is, (S2$t$+S1$t$)/2 in Expression (4) also becomes α-fold, the Zt obtained from Expression (3) is not changed.

That is, in the surface position detection device 100 of the first embodiment, a highly accurate surface position detection device that is not susceptible to variation of the reflectance of the detected surface WA can be realized.

In the above description, since the light amount distribution IDL1 of the first detection light DL1 radiated on the detected surface WA and the light amount distribution IDL2 of the second detection light DL2 are sinusoidal functions with respect to the X, the calculation unit PU calculates the detection position Zt on the basis of Expression (3) that includes the inverse cosine function.

However, in a case where the light amount distribution IDL1 and the light amount distribution IDL2 are other functions that are not the sinusoidal functions, the calculation unit PU may calculate the detection position Zt on the basis of an inverse function of the other function. Accordingly, the light amount distribution IDL1 of the first detection light DL1 radiated on the detected surface WA and the light amount distribution IDL2 of the second detection light DL2 are not limited to the sinusoidal function with respect to the X and may be another function.

However, at least in a portion corresponding to the detection region DA, the light amount distribution IDL1 and the light amount distribution IDL2 need to be smooth. This is because, when the light amount distribution IDL1 and the light amount distribution IDL2 are not smooth, that is, when the light amount distribution is changed not to be differentiable in the X direction at an arbitrary position, it becomes difficult to calculate the detection position Zt with high accuracy from the value S1$t$ of the photoelectric conversion signal S1$b$ and the value S2$t$ of the photoelectric conversion signal S2$b$. The smoothness may be defined as the function having a continuous differential coefficient (derivative function) within a certain interval (that is, is not bent). A definition that the light amount distribution IDL1 and the light amount distribution IDL2 are smooth in a portion corresponding to the detection region DA may be that, when the light amount distribution IDL1 and the light amount distribution IDL2 are fitted by a function, the fitted function has a continuous differential coefficient in the portion corresponding to the detection region DA.

When the light amount distribution IDL1 and the light amount distribution IDL2 are the sinusoidal functions as described above, since the calculation unit PU can calculate the detection position Zt using a common inverse cosine function or an inverse sine function, it is possible to simplify the configuration of the calculation unit PU.

The calculation unit PU may not calculate a surface position itself of the detected surface WA as described above and may calculate a conversion surface position in which the surface position of the detected surface WA is represented by an internal coordinate in the surface position detection device 100 or the like. Hereinafter, the surface position and the conversion surface position of the detected surface WA are also collectively or individually referred to as surface position information of the detected surface WA.

The calculation unit PU may calculate the amplitude A1 from the sum of the value S1$t$ of the photoelectric conversion signal S1$b$ and the value S2$t$ of the photoelectric conversion signal S2$b$ on the basis of Expression (4). In this case, it is preferable that, before the measurement of the measured object W is performed, the amplitude A1 (hereinafter, referred to as an amplitude A0) with respect to a reference measurement object having a known reflectance of the detected surface WA be further calculated. Thereby, the calculation unit PU can calculate the reflectance of the detected surface WA of the measured object W from the ratio of the amplitude A1 to the amplitude A0.

The above description is based on the photoelectric conversion signals S1$b$ and S2$b$ of the images IM1$b$ and IM2$b$ formed of the second wavelength components in the first detection light DL1 and the second detection light DL2, respectively. However, of course, even when any one of pairs of images (a pair of the image IM1$a$ and the image IM2$a$, a pair of the image IM1$b$ and the image IM2$b$, and a pair of the image IM1$c$ and the image IM2$c$) formed by the first detection light DL1 and the second detection light DL2 in each wavelength component is used, it is possible to perform the calculation of the position information of the detected surface WA according to the method described above. Further, the position information of the detected surface WA may be calculated by using each of the pairs of the images formed by the first detection light DL1 and the second detection light DL2 in each wavelength component.

In the case of the semiconductor wafer in the formation process of the integrated circuit described above or the like, the reflectance of the detected surface W may differ depending on the wavelength of the detection light depending on the internal structure and the like. Accordingly, the calculation unit PU may calculate position information of the detected surface WA from each of the pairs of images by a plurality of wavelength components in the first detection light DL1 and the second detection light DL2, statistically process the plurality of calculated position information, and calculate final position information of the detected surface WA. The plurality of position information of the detected surface WA calculated from each of the pairs of images by the plurality of wavelength components may be interpreted as a position information element in order to be distinguished from the final position information of the detected surface WA.

Further, by performing the detection and the calculation similar to those described above of not only the image of the P polarization component received by the light detection portion 28$a$ but also the image of the opening portion SL of the S polarization component received by the light detection portion 28$b$, it is possible to calculate each of a plurality of position information elements of the detected surface WA.

The calculation unit PU may calculate an average value of the plurality of position information elements as the statistical process described above. In addition, the calculation unit PU may calculate, from a pair of images by a plurality of wavelength components, the reflectance of the detected surface WA of the measured object W at the wavelength for each P polarization component and S polarization component and calculate final position information on the basis of the polarization and the position information element and the reflectance for each wavelength.

The calculation unit PU may correct the calculated position information of the detected surface WA regarding the Z direction using information of a Z position of the stage ST measured by the interferometer or the encoder (not shown).

Further, the position information regarding the Z direction may be acquired throughout the entire surface of the detected surface WA by detecting the position in the Z direction of the detected surface WA while controlling and scanning the stage ST in the X direction and the Y direction by a control unit (not shown).

Modification Example 1

In the first embodiment described above, the surface position detection device 100 detects the position in the Z direction perpendicular to the detected surface WA of the measured object W. However, the position is not limited to a position in a direction perpendicular to the detected surface WA, and the position in a direction that intersects the detected surface WA may be detected.

Modification Example 2

In the first embodiment, the longitudinal direction of the opening portion SL on the incident surface 23a of the light reception prism 23 shown in FIG. 6 is matched with the Y direction. However, the longitudinal direction of the opening portion SL is not necessarily matched with the Y direction, may be deviated by a predetermined angle from the Y direction within the plane of the incident surface 23a, and may be the x2 direction in FIG. 6, that is, a direction that intersects the direction having an imaging relationship with the X direction on the detected surface WA. In this case, the longitudinal direction of the detection region DA on the detected surface WA and each image (IM1a to IM1c, IM2a to IM2c, and the like) of the opening portion SL formed on the light reception surfaces 29a and 29b is also deviated by a predetermined angle from the Y direction. In order to deal with this, the shape of each photoelectric conversion unit in the light reception surfaces 29a and 29b may be a shape that includes each image (IM1a to IM1c, IM2a to IM2c, and the like), and the longitudinal direction of the above-described pattern having a rectangular shape that constitutes the diffraction grating 14a may be deviated by a predetermined angle from the Y direction.

In the surface position detection device 100 of the first embodiment, both the light amount distribution IDL1 of the first detection light DL1 on the detected surface WA and the light amount distribution IDL2 of the second detection light DL2 are constant within a predetermined range in the Y direction. However, in a case where the longitudinal direction of the detection region DA is deviated by a predetermined angle from the Y direction as described above, it is preferable that both the light amount distribution IDL1 and the light amount distribution IDL2 be constant within a predetermined range in a direction that is deviated by a predetermined angle from the Y direction.

As understood from the above detection principle, the light amount distribution IDL1 and the light amount distribution IDL2 do not always need to be constant in the Y direction or a direction that is rotated by a predetermined angle from the Y direction. That is, the sum of the light amount distributions of the width Dwy in the Y direction of the detection region DA or the direction that is rotated by a predetermined angle from the Y direction may be constant at each position in the X direction.

However, both the light amount distribution IDL1 and the light amount distribution IDL2 are caused to be constant within a predetermined range in the Y direction or the direction that is rotated by a predetermined angle from the Y direction, and thereby, the impact of the variation of the reflectance is small even in a case where the reflectance of the detected surface WA is greatly varied in the Y direction. As a result, it is possible to perform detection of the surface position with further high accuracy.

Modification Example 3

The first detection light DL1 and the second detection light DL2 do not always need to enter the detected surface WA at the same incident angle θ. For example, the incident angles of the first detection light DL1 and the second detection light DL2 may be different from each other to a certain degree. In this case, by adding an optical member such as a prism that adjusts the difference between the incident angles of the +1st-order diffraction light DP and the −1st-order diffraction light DM included in each of the first detection light and the second detection light, it is possible to match the frequencies FX in the X direction of the light amount distributions of the first detection light DL1 and the second detection light DL2 on the detected surface WA with each other.

However, by equalizing the incident angles of the first detection light DL1 and the second detection light DL2, it is not necessary to add such an optical member, and there is an advantage in that it is possible to simplify the optical system.

Modification Example 4

The sum of the light amounts of the first detection light DL1 and the second detection light DL2 in the irradiation region IA of the detected surface WA may not necessarily be constant along the X direction. As described above, the first detection light DL1 and the second detection light DL2 are received at different positions of the light reception surfaces 29a and 29b of the light detection portion 28a and 28b. Therefore, in the light detection portions 28a and 28b, the sensitivity of the photoelectric conversion with respect to the first detection light DL1 and the second detection light DL2 may be separately set easily.

Accordingly, this is because it is possible to obtain the photoelectric conversion signals S1a and S1b having the same amplitude by adjusting the sensitivity of the photoelectric conversion of the light detection portions 28a and 28b, for example, even when the light amount distribution IDL1 by the first detection light DL1 and the light amount distribution IDL2 by the second detection light DL2 are different from each other.

However, by causing the sum of the light amounts of the first detection light DL1 and the second detection light DL2 in the irradiation region IA of the detected surface WA to be constant, it is possible to omit the sensitivity adjustment by the light detection portions 28a and 28b or the calculation unit PU, and it is possible to simplify the configuration of the surface position detection device 100.

Modification Example 5

In the surface position detection device 100 of the first embodiment, the light-shielding portion OF and the opening portion SL are formed on the incident surface 23a of the light reception prism 23, and the opening portion SL defines the detection region DA on the detected surface WA. However, since the detected surface WA, the opening portion SL, and the light reception surfaces 29a and 29b are in an imaging relationship (conjugate), a light reception region (a region where the photoelectric conversion is performed) in the light reception surfaces 29a and 29b may be limited instead of providing the light-shielding portion OF. That is, the width in the x3 direction of each light reception region may be set to be narrower than the width in the Y direction. Alternatively, in a case where the two-dimensional image sensor is used as the light detection portion 28a, the calculation unit PU may perform the calculation of the surface position of the detected surface WA by using only the photoelectric conversion signal from a light reception pixel that corresponds to the opening portion SL instead of providing the light-shielding portion OF. That is, the calculation unit PU may calculate the surface position of the detected surface WA by using the photoelectric conversion signal from the light reception pixel within a range where the width in the x3 direction is narrower than the width in the Y direction of the two-dimensional image sensor. At this time, the compound separation member 25 may be omitted. Alternatively, the detection light from the light source 10 may be monochromatic light.

Modification Example 6

In the surface position detection device 100 of the first embodiment, the detection light division member 16 is arranged at the light transmission unit; however, the member that divides the first detection light DL1 and the second detection light DL2 is not limited to the detection light division member 16 arranged on the pupil plane TP of the light transmission unit.

For example, the optical system may be constituted such that the first detection light DL1 and the second detection light DL2 are formed to be superimposed on the detected surface WA without using the detection light division member 16.

Further, the detection light division member 16 is not limited to the member constituted of a plurality of prisms described above. For example, a division mirror constituted of a plurality of reflection surfaces that are not parallel to one another may be used.

(Surface Position Detection Device of Second Embodiment)

Next, a surface position detection device 100a of a second embodiment is described. However, since most parts of the surface position detection device 100a of the second embodiment are common to the surface position detection device 100 of the first embodiment described above, only the differences are described below, and the common points are not described.

Figure 10:
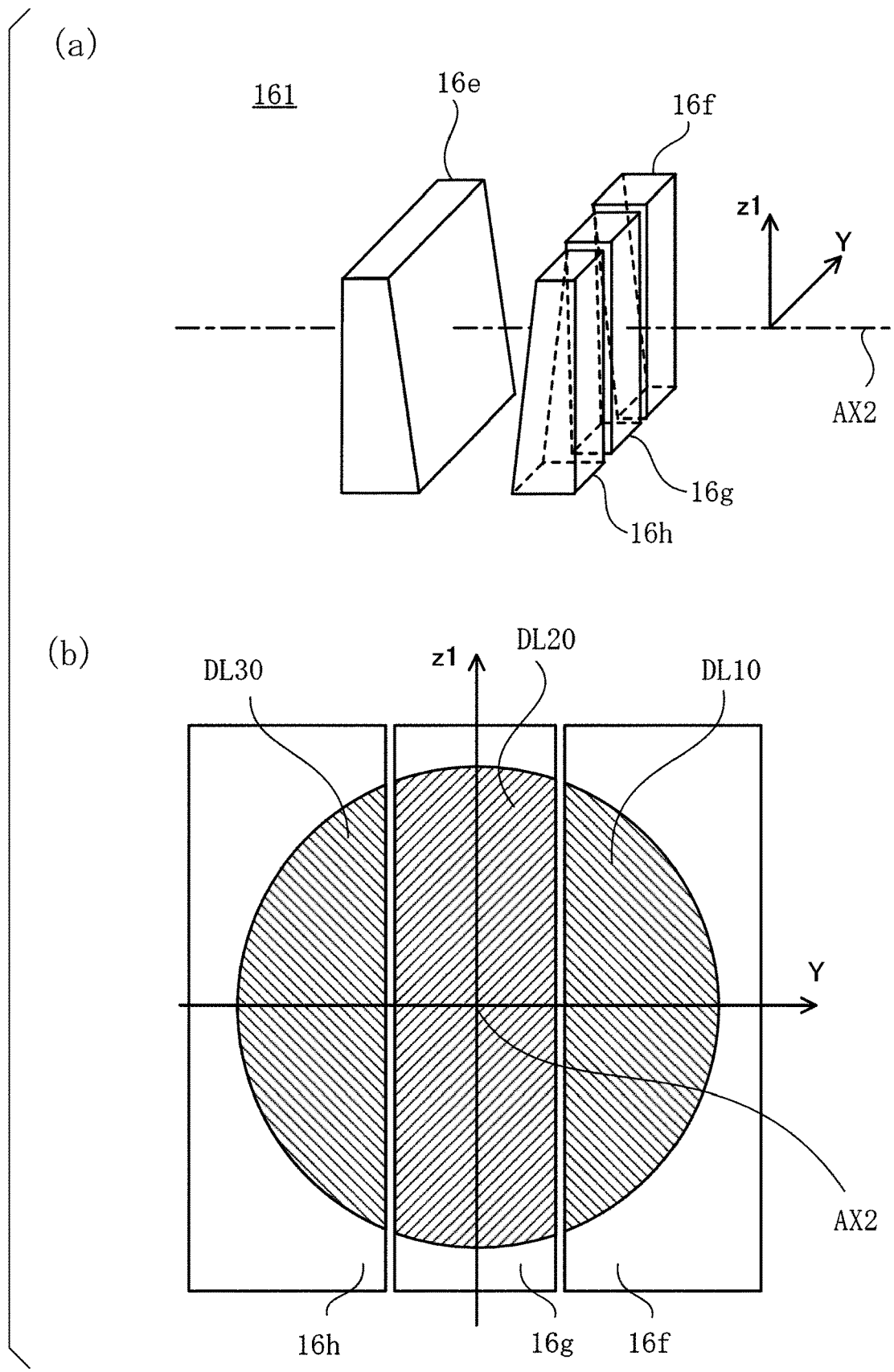
FIG. 10 (a) is a perspective view showing a detection light division member of another example, and FIG. 10 (b) is a view of the detection light division member of another example when seen from a light transmission-side first lens 17 side.

In the surface position detection device 100a of the second embodiment, a detection light division member 161 shown in FIG. 10 (a) is used instead of the detection light division member 16 in the first embodiment shown in FIG. 4 (a).

FIG. 10 (a) is a perspective view showing the detection light division member 161, and FIG. 10 (b) is a view of the detection light division member 161 when seen from the light transmission-side first lens 17 side. The optical axis AX2 and the Y axis of FIG. 10 are the same as the optical axis AX2 and the Y axis of FIG. 4, respectively. The detection light division member 161 includes: a prism 16e having a thickness in the optical axis AX2 direction that is changed depending on the position of z1; and three prisms 16f to 16h arranged in contact with each other in the Y direction at a position away from the prism 16e to the downstream side of the optical path in the optical axis AX2 direction.

The three prisms 16f to 16h are arranged in contact with each other in the Y direction, the boundaries between the prisms are parallel to the z1 direction, and the thicknesses in the optical axis AX2 direction of the prisms are different from one another depending on the position of z1.

As a result, the detection light division member 161 divides, at the pupil surface TP, the detection light into three detection lights which are first detection light DL10, second detection light DL20, and third detection light DL30 in the Y direction. Then, the detection light division member 161 deflects the proceeding direction of the first detection light DL10, the second detection light DL20, and the third detection light DL30 by a minute angle in the z1 direction.

Figure 11:
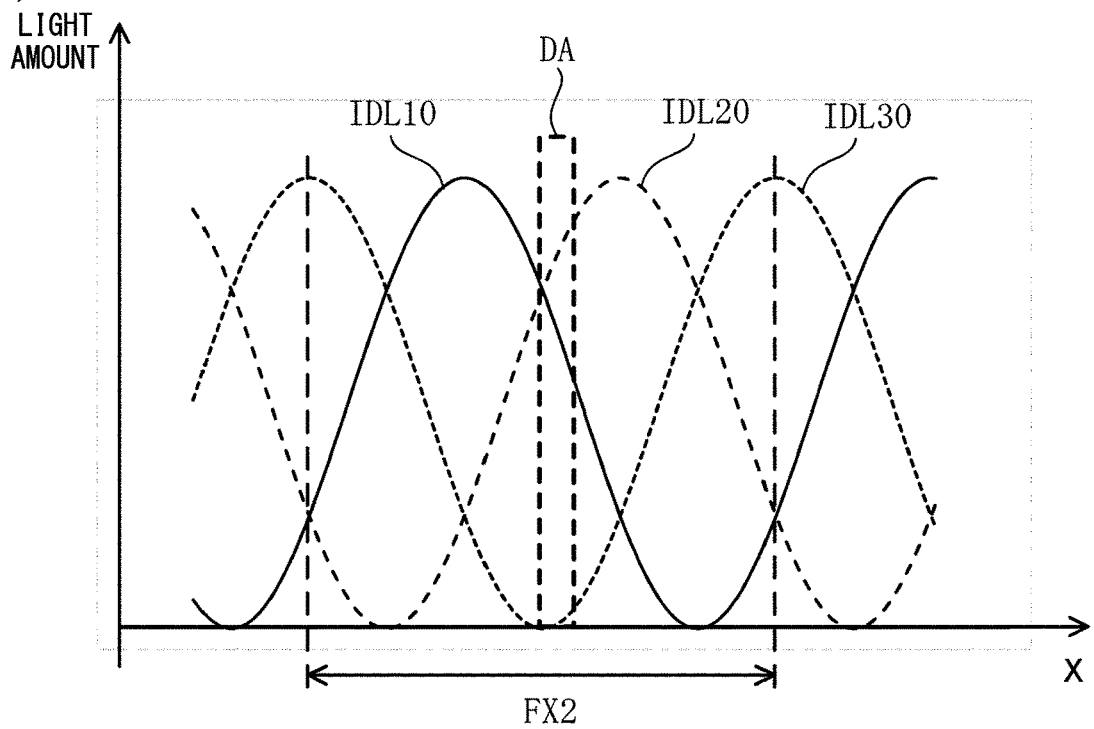
FIG. 11 (a) is a view representing a light amount distribution of first detection light, second detection light, and third detection light on the detected surface WA in a surface position detection device of a second embodiment, and FIG. 11 (b) is a view showing a relationship between a position (horizontal axis) in a Z-axis direction of the detected surface WA and a photoelectric conversion signal.
Figure 11:
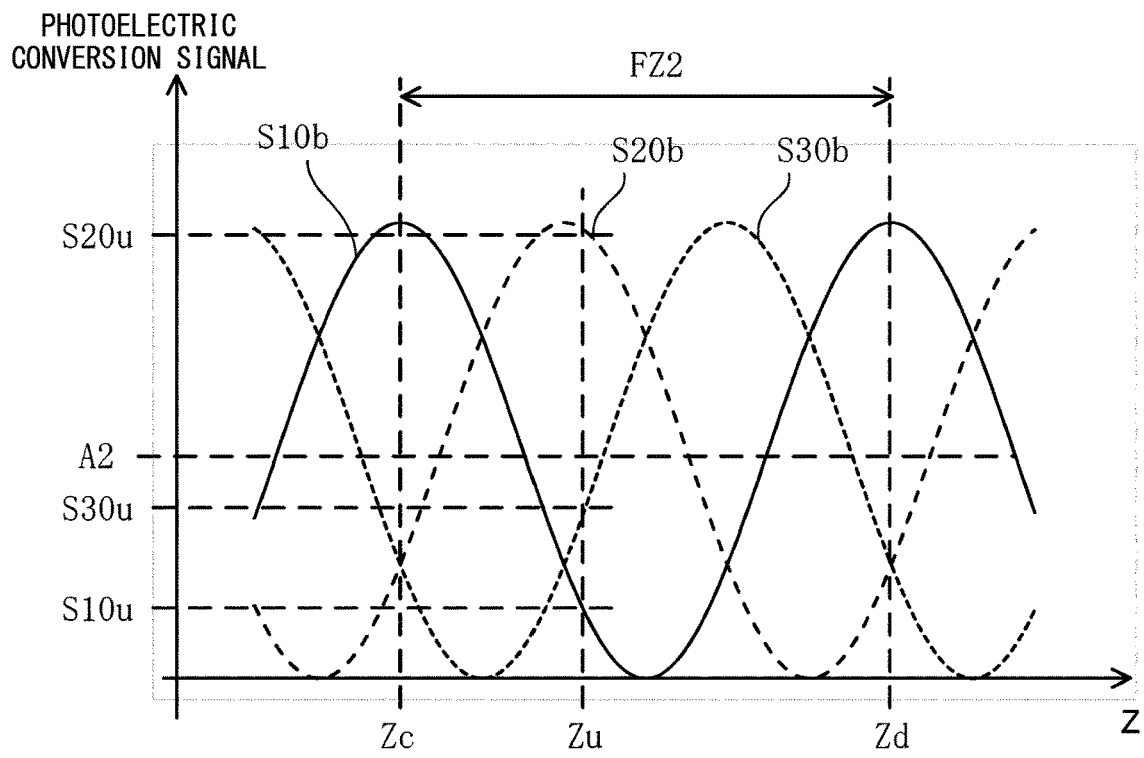

FIG. 11 (a) is a view representing light amount distributions IDL10, IDL20, and IDL30 of the first detection light DL10, the second detection light DL20, and the third detection light DL30, respectively, on the detected surface WA in the surface position detection device 100a of the second embodiment.

By appropriately setting the deflection amount of the first detection light DL10, the second detection light DL20, and the third detection light DL30 by the detection light division member 161, the light amount distributions IDL10, IDL20, and IDL30, respectively, are light amount distributions that are displaced by one third of the period FX2 of the intensity modulation thereof from each other.

The detection light division member 161 divides the detection light into the three detection lights which are the first detection light DL10, the second detection light DL20, and the third detection light DL30 in the Y direction at the pupil surface TP of the light transmission unit. Accordingly, in the surface position detection device 100a of the second embodiment, even in the light separation member 25a of the compound separation member 25 arranged on the pupil surface RP2 of a light reception unit, the detection light is divided into three in the Y direction of the pupil surface RP2. Specifically, a new block in which both of an incident surface and an emission surface are perpendicular to the optical axis AX6 may be added between the first block 251 and the second block 252 of the light separation member 25a shown in FIG. 7 (b). Then, the shape of the surface on an incident side surface of the third block 253 may be matched with the shape of the surface on an emission side surface of the first block 251, the second block 252, and the new block.

As a result, images by the first detection light DL10, the second detection light DL20, and the third detection light DL30 of the opening portion SL are formed separately from one another in the Y direction on the light reception surfaces 29a and 29b.

As an example, FIG. 11 (b) is a view showing a relationship between a position (horizontal axis) in the Z-axis direction of the detected surface WA and a photoelectric conversion signal S10b of an image IM10b by a second wavelength component of the first detection light DL10, a photoelectric conversion signal S20b of an image IM20b by a second wavelength component of the second detection light DL20, and a photoelectric conversion signal S30b of an image IM30b by a second wavelength component of the third detection light DL30.

The photoelectric conversion signal S10b, the photoelectric conversion signal S20b, and the photoelectric conversion signal S30b are signals having the same period FZ and the same amplitude A2 with respect to the position in the Z-axis direction of the detected surface WA and having a phase that is displaced by ⅓ of the period FZ represented by the following Expression (5) to Expression (7).

$$S10b = A2 + A2 \times \cos\{2\pi(Z-Zc)/FZ2\} \quad (5)$$

$$S20b = A2 + A2 \times \cos\{2\pi(Z-Zc)/FZ2 - 2\pi/3\} \quad (6)$$

$$S30b = A2 + A2 \times \cos\{2\pi(Z-Zc)/FZ2 - 4\pi/3\} \quad (7)$$

The Zc is a Z position of the detected surface WA where the photoelectric conversion signal S10$b$ is maximized. The Zd shown in FIG. 11 ($b$) is a position that is away toward the +Z side of the Zc by the period FZ2.

The calculation unit PU calculates a candidate (Zu1 to Zu3) of a Z position Zu of the detected surface WA that is located at an arbitrary position between Za and Zb from a value S10$u$ of the photoelectric conversion signal S10$b$, a value S20$u$ of the photoelectric conversion signal S20$b$, and a value S20$u$ of the photoelectric conversion signal S30$b$ by a calculation based on Expression (8) to Expression (11).

$$Zu1 = FZ2 \times [\cos-1\{(S10u-A2)/A2\}]/2\pi + Zc \quad (8)$$

$$Zu2 = FZ2 \times [\cos-1\{(S20u-A2)/A2\} + 2\pi/3]/2\pi + Zc \quad (9)$$

$$Zu3 = FZ2 \times [\cos-1\{(S20u-A2)/A2\} + 4\pi/3]/2\pi + Zc \quad (10)$$

$$A2 = (S10u + S20u + S30u)/3 \quad (11)$$

From the nature of the inverse cosine function, two values are obtained for each of the candidates Zu1 to Zu3 of the Z position Zu in a range from Zc to Zd. By employing values that are substantially matched with one another among the obtained values and performing an averaging process of Expression (12), the calculation unit PU calculates the Z position Zu of the detected surface WA.

$$Zu = (Zu1 + Zu2 + Zu3)/3 \quad (12)$$

Even in the second embodiment, when the width Dwx in the X direction of the detection region DA is shorter than half of the period FX in the X direction of the light amount distribution IDL10 to the light amount distribution IDL30, the variation of the photoelectric conversion signal S10$b$ to the photoelectric conversion signal S30$b$ can be increased when the detected surface WA is varied in the Z direction. As a result, it is possible to further improve the detection accuracy.

In the second embodiment, since the light amount distributions IDL10, IDL20, and IDL30 having a different phase by one third of the period FX2 of the intensity modulation are formed on the detected surface WA, the photoelectric conversion signals S10$b$ to S30$b$ are also changed as a so-called three-phase signal with respect to the Z position of the detected surface WA. Therefore, the position of the detected surface WA can be detected in a wider range (Zc to Zd) of Z compared to the first embodiment.

The above embodiment is described using the photoelectric conversion signals S10$b$, S20$b$, and S30$b$ of the second wavelength component in the first detection light DL10 to the third detection light DL0; however, the position of the detected surface WA can be calculated using the photoelectric conversion signal of each wavelength component of each detection light DL10 to DL30 in the same manner as in the first embodiment.

Further, by performing the detection and the calculation similar to those described above of not only the image of the P polarization component received by the light detection portion 28$a$ but also the image of the opening portion SL of the S polarization component received by the light detection portion 28$b$, it is possible to calculate each of a plurality of position information elements of the detected surface WA. The method of calculating final position information of the detected surface WA from the plurality of calculated position information elements is similar to the method in the first embodiment described above.

The configuration property described in each modification example of the first embodiment described above may also be applied to the surface position detection device of the second embodiment by adding appropriately required modifications.

Effects of First Embodiment, Second Embodiment, and Each Modification Example (1) The surface position detection devices 100, 100$a$ of the first embodiment, the second embodiment, and each modification example described above are the surface position detection device 100 that obtains position information of a detected surface WA along an axis (Z axis) that intersects the detected surface WA, the surface position detection device including: the light transmission unit TS by which a plurality of detection lights (DL1, DL2, and the like) having a smoothly modulated intensity in the detected surface WA in a first direction (X direction) within the detected surface WA are radiated and superimposed onto the detected surface WA obliquely from a direction having a direction component in the first direction and form an irradiation region IA on the detected surface WA; the light reception unit RS that has the light detection portions 28$a$ and 28$b$ having the light reception surfaces 29$a$ and 29$b$ arranged at an optically conjugated position with respect to the detected surface WA, receives at a different position of each of the light reception surfaces 29$a$ and 29$b$, the plurality of detection lights (DL1, DL2, and the like) reflected by the detection region DA of which the width DWx in the first direction is a predetermined value in the irradiation region IA, and outputs each photoelectric conversion signal of the plurality of detection lights (DL1, DL2, and the like); and the calculation unit PU that calculates position information of the detected surface WA based on the photoelectric conversion signal of the plurality of detection lights output from the light reception unit RS. According to this configuration, a highly accurate surface position detection device 100 that is not susceptible to variation of the reflectance of the detected surface WA can be realized.

(2) By causing the light intensity in the second direction that intersects the first direction (X direction) in the irradiation region IA to be constant with respect to each of the plurality of detection lights (DL1, DL2, and the like), the impact of the variation of the reflectance is small even in a case where the reflectance of the detected surface WA is greatly varied in a direction that intersects the first direction. As a result, it is possible to perform detection of the surface position with higher accuracy.

(3) By causing the sum of the light amounts of the plurality of detection lights (DL1, DL2, and the like) in the detection region DA on the detected surface WA to be constant along the first direction (X direction), it is possible to easily calculate the reflectance of the detection region DA from the sum of photoelectric conversion signals (Sib, S2$b$, and the like) of the plurality of detection lights that are received by the light detection portions 28$a$ and 28$b$ and are photoelectrically converted. Then, the calculated reflectance is reflected in the calculation of the surface position of the detection region DA, and thereby, it is possible to perform detection of the surface position with further higher accuracy.

(4) By causing each of the plurality of detection lights (DL1, DL2, and the like) to have a modulated intensity in the first direction (X direction) by the sinusoidal function having the same period FX and the same amplitude and have a different phase from each other in the first direction of the sinusoidal function in the detected surface WA, it is possible to simplify the configuration of the calculation unit PU.

(5) By causing the plurality of detection lights to be a configuration that includes the first detection light DL10, the second detection light DL20, and the third detection light DL30 each having phases of the sinusoidal function different by one third of the period FX2 from one another, it is possible to detect the position on the detected surface WA over a wider range in a measurement direction (Z direction).

(6) By causing the width Dwx in the first direction (X direction) of the detection region DA to be shorter than half of the period FX of the sinusoidal function, it is possible to increase the variation of the photoelectric conversion signals S1b and S2b and the like when the detected surface WA is varied in the Z direction. As a result, it is possible to further improve the detection accuracy.

(7) A configuration can be employed in which each of the plurality of detection lights (DL1, DL2, and the like) radiated on the detected surface WA by the light transmission unit TS has a different wavelength, and the light reception unit RS includes the spectroscopic member 25b that disperses each of the plurality of detection lights depending on the wavelength and guides the dispersed detection lights to different positions on the light reception surfaces 29a and 29b. Further, a configuration can also be employed in which each of the light detection portions 28a and 28b outputs photoelectric conversion signals (S1b, S2b, and the like) for each of a plurality of different wavelengths that enters a different position with respect to each of the plurality of detection lights (DL1, DL2, and the like), and the calculation unit PU calculates position information of the detected surface WA on the basis of the photoelectric conversion signals (S1b, S2b, and the like) of the plurality of detection lights for each of the plurality of different wavelengths. In this case, since the position of the detected surface WA is detected by the detection light of a plurality of different wavelengths, the position of the detected surface WA can be detected with higher accuracy.

In the surface position detection device of the first and second embodiments, the position information of the detected surface WA may not be obtained. As an example, in the surface position detection device of the first and second embodiments, a spectral reflectance distribution of the detected surface WA may be measured without obtaining the position information of the detected surface WA.

(Exposure Apparatus of Third Embodiment)

Figure 12:
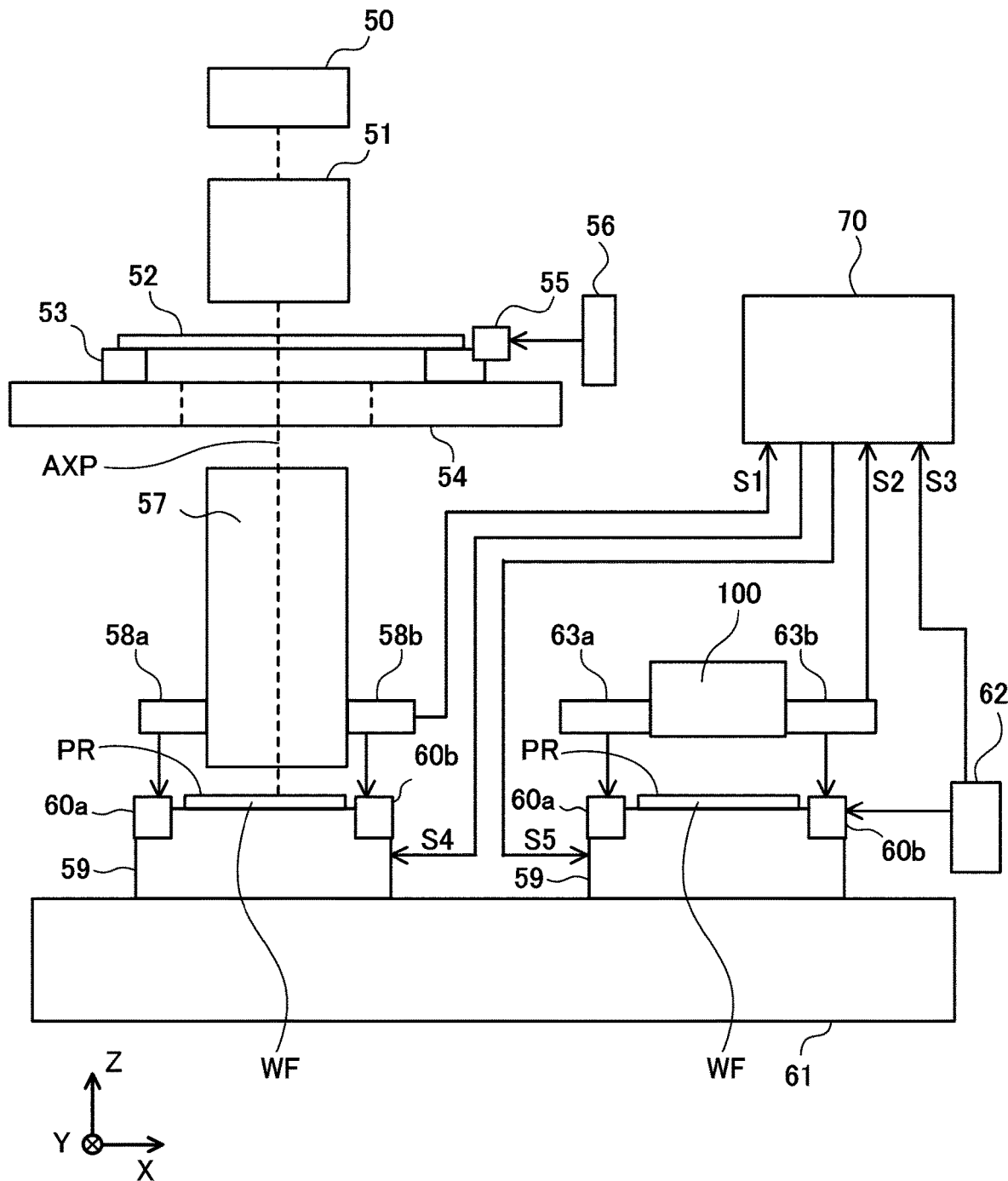
FIG. 12 is a view schematically showing an exposure apparatus 200 of a third embodiment.

FIG. 12 is a view schematically showing an exposure apparatus 200 of a third embodiment. The exposure apparatus 200 of the third embodiment is an exposure apparatus for exposing and transferring an exposure pattern to a photoresist (resist) PR formed on a surface of a semiconductor wafer or a substrate (hereinafter, collectively referred to as a "substrate") WF for a display device. The exposure apparatus 200 includes the surface position detection device 100, 100a of the first embodiment or the second embodiment described above. The surface position detection device 100, 100a treats the substrate WF as the measured object W described above and treats the surface of the photoresist formed on the surface of the substrate WF as the detected surface WA described above.

In the direction of XYZ axes of FIG. 12, a direction parallel to an optical axis AXP of a projection optical system 57 is a Z-axis direction.

The substrate WF carried in the exposure apparatus 200 is mounted on a movable substrate stage 59 on a platen 61 and is arranged below the surface position detection device 100 by the movement of the substrate stage 59. A control device 70 causes the surface position detection device 100 to detect position information in the Z direction of a plurality of points of the surface of the substrate WF while sending a control signal S5 and moving the substrate stage 59 in an XY plane. At this time, the position information in the Z direction of the substrate stage 59 on which the substrate WF is mounted is measured by interferometers 63a and 64b that are held integrally with the surface position detection device 100 via the positions of reference mirrors 60a and 60b. The position in the XY-direction of the substrate stage 59 is measured by an interferometer 62 via the position of the reference mirror 60b. The interferometers 63a and 64b may be interpreted as a first measurement unit.

Information about the Z-direction position of the surface of the substrate WF detected by the surface position detection device 100 and position information in the Z direction of the substrate stage 59 are transmitted as a signal S2 to the control device 70. Position information in the XY direction of the substrate stage 59 is transmitted as a signal S3 to the control device 70. Map data representing the position information in the Z direction with respect to the XY position of the surface of the substrate WF is generated in the control device 70 on the basis of the signal S2 and the signal S3.

Subsequently, the control device 70 moves the substrate stage 59 in the XY plane such that the substrate WF is arranged below the projection optical system 57 and exposes the resist PR formed on the surface of the substrate WF. The exposure may be so-called step exposure or may be scan exposure. Upon exposure, the control device 70 controls the substrate stage 59 on the basis of the map data representing the position information in the Z direction with respect to the XY position of the surface of the substrate WF. That is, the control device 70 transmits a control signal S4 to the substrate stage 59, moves the substrate stage 59 in the XY direction, and drives the substrate stage 59 in the Z direction such that the surface of the substrate WF in an exposure field of the projection optical system 57 is matched with an image surface of the projection optical system 57. If necessary, the control device 70 minutely rotates (levels) the substrate stage 59 such that the Y-axis direction and the X-axis direction are rotation centers.

The position in the Z direction of the substrate stage 59 during exposure is measured by interferometers 58a and 58b held integrally with the projection optical system 57 via positions of reference mirrors 60a and 60b and is transmitted as a signal S1 to the control device 70. The position in the XY direction of the substrate stage 59 during exposure is measured by an interferometer 62 via a position of the reference mirror 60b and is transmitted as a signal S3 to the control device 70. The interferometers 58a and 58b may be interpreted as a second measurement unit.

The control device 70 controls the substrate stage 59 during exposure on the basis of the map data representing the position information in the Z direction with respect to the XY position of the surface of the substrate WF described above, the signal S1, and the signal S3.

In the exposure operation described above, illumination light from an exposure light source 50 is illuminated via an illumination optical system 51 to an original plate (mask pattern) drawn on a mask 52. As a result, an image of the original plate is projected via the projection optical system 57 to the resist PR on the substrate WF, and the resist PR is exposed with an exposure pattern.

In a case where the exposure operation is the scan exposure, the mask 52 and the substrate WF synchronize and scan relative to the projection optical system 57 during the exposure operation. For this scanning, the mask 52 is mounted on the mask stage 53, and the mask stage 53 is moveable in the X direction on a mask platen 54. The position of the mask stage 53 is measured by a mask interferometer 56 via a position of a mask reference mirror 55.

In a case where the exposure operation is a step exposure, the substrate stage 59 is stationary during exposure of one shot, and the substrate stage 59 moves in the X direction or the Y direction by a predetermined distance between shots.

The projection optical system 57 may be a so-called immersion optical system in which a liquid is provided between the projection optical system 57 and the substrate WF. Alternatively, the exposure apparatus 200 is not limited to an apparatus that performs exposure by light or ultraviolet light and may be an apparatus that performs exposure by an electron beam or X-ray.

The interferometers 58a, 58b, 63a, 63b, and 62 are not limited to interferometers and may be encoders for position measurement.

(Effects of Exposure Apparatus of Third Embodiment)
(8) The exposure apparatus 200 of the third embodiment includes the surface position detection device 100 of the first embodiment or the second embodiment as a device that detects the position in the Z direction of the surface of the substrate WF on which the resist PR is formed. According to this configuration, it is possible to reduce the measurement error caused by the reflectance distribution at the surface of the substrate WF and measure the surface position of the surface of the substrate WF with high accuracy. As a result, in the exposure apparatus of the third embodiment, it is possible to perform position alignment of the surface of the substrate WF on which the resist PR is formed with respect to the projection optical system 57 with high accuracy, and therefore, it is possible to perform good projection exposure.

Figure 13:
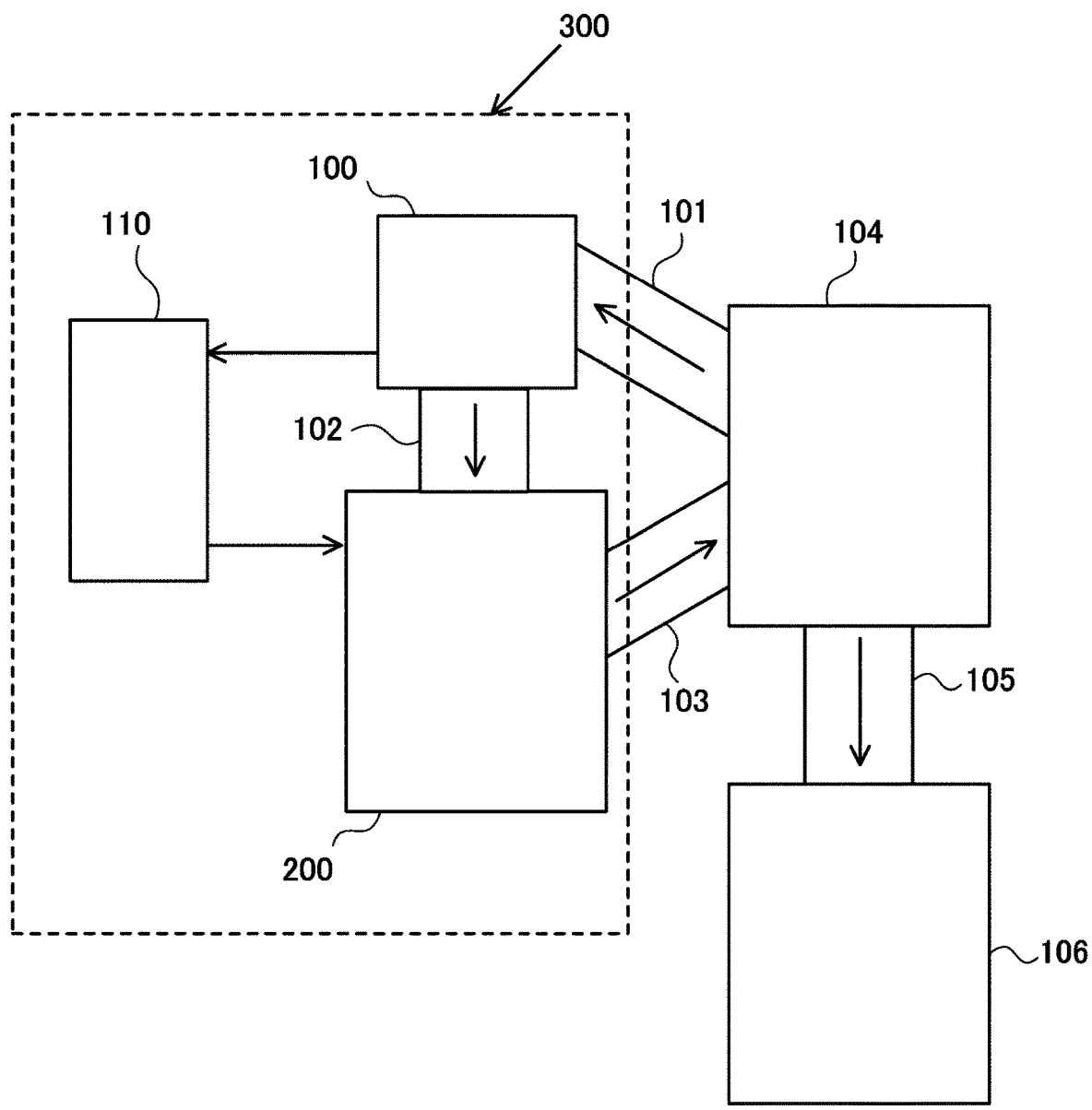
FIG. 13 is a view schematically showing a substrate-processing line that includes a substrate-processing system 300 of a fourth embodiment.

(Substrate-Processing System of Fourth Embodiment)
FIG. 13 is a view schematically showing a substrate-processing line that includes a substrate-processing system 300 of a fourth embodiment. The substrate-processing system 300 includes: the surface position detection device 100, 100a of the first embodiment, the second embodiment, or each modification example described above; the exposure apparatus 200 of the second embodiment described above; and a data-holding device 110.

In the substrate-processing system 300, a substrate WF having a surface on which a resist PR is formed by a coater developer (track system) 104 is transported to the surface position detection device 100 by a transport mechanism 101. The surface position detection device 100 includes, in the inside thereof, a stage ST on which the substrate WF is mounted, and the stage ST detects the position information of the surface of the substrate WF across a front surface of the substrate WF by moving the substrate WF in a direction within the surface. Further, the surface position detection device 100 may measure the reflectance of the surface of the substrate WF. Further, the surface position detection device 100 may measure a plurality of position information and reflectance of the surface of the substrate WF for each detection wavelength. The position information of the surface of the substrate WF measured by the surface position detection device 100 or even information of the reflectance is transmitted to the data-holding device 110 and is temporarily stored.

The substrate WF of which the surface position is detected by the surface position detection device 100 is transported to the exposure apparatus 200 by the transport mechanism 102. The position information of the surface of the substrate WF or even the information of the reflectance stored in the data-holding device 110 is also transmitted to the exposure apparatus 200. In the exposure apparatus 200, the position of the surface of the substrate WF is detected using the position information of the surface of the substrate WF measured by the surface position detection device 100 or even the information of the reflectance. Then, the exposure apparatus 200 operates the substrate stage 59, causes the surface of the substrate WF to be matched with an image surface of the projection optical system 57, and exposes an exposure pattern onto a resist PR on the surface of the substrate WF.

In the substrate-processing system 300 of the fourth embodiment, the position information of the surface of the substrate WF or more accurate information of the reflectance has already been measured in the surface position detection device 100. Accordingly, the surface position detection device 100 in the exposure apparatus 200 may be omitted, and alternatively, a conventional surface position detection device may be used.

The substrate WF exposed by the exposure apparatus 200 is transported to the coater developer 104 by a transport mechanism 103, and the resist PR on the substrate WF is developed by the coater developer 104. Then, the substrate WF is transported to a processing device 106 by a transport mechanism 105. The surface of the substrate WF or a film formed on the surface of the substrate WF is processed (etched, ion implanted, or the like) by the processing device 106 using the developed resist PR as a mask, that is, on the basis of the resist pattern PR formed in the resist PR. Accordingly, the substrate-processing system 300 can form a circuit pattern on the basis of the exposure pattern exposed to the resist PR on the substrate WF and fabricate a device.

In the substrate-processing system 300 of the fourth embodiment described above, the data-holding device 110 that temporarily stores the position information of the surface of the substrate WF measured by the surface position detection device 100 or even the information of the reflectance is provided; however, the embodiment is not limited thereto. The data-holding device 110 may be embedded in the surface position detection device 100 or may be embedded in the exposure apparatus 200. Alternatively, the data-holding device 110 may be included in a computer or a storage device that manages a device factory such as a semiconductor factory where the surface position detection device 100 and the exposure apparatus 200 are installed and that is connected to the surface position detection device 100 and the exposure apparatus 200 by a network.

(Effects of Substrate-Processing System of Fourth Embodiment)

(9) The substrate-processing system of the fourth embodiment is the substrate-processing system 300 in which the substrate WF is a processing target, the substrate-processing system including: a measurement device having a first stage ST on which the substrate WF is mounted and the surface position detection device 100, 100a of the first embodiment, the second embodiment, or the modification example described above that measures a position in a direction (Z direction) which intersects the surface of a plurality of points on the surface of the substrate WF; and the exposure apparatus 200 that includes a second stage 59 on which the substrate WF for which the measurement by the measurement device has been completed is mounted and that exposes the substrate WF which is mounted on the second stage 59. The exposure apparatus 200 performs the exposure while changing a position in the direction which intersects the surface of the substrate WF using at least a measurement result by the measurement device 100, 100a.

According to this configuration, it is possible to reduce the measurement error caused by the reflectance distribution at the surface of the substrate WF and perform position alignment of the surface of the substrate WF on which the resist PR is formed with respect to the projection optical system 57 with high accuracy. Thereby, it is possible to form a good exposure pattern on the substrate WF.

(Device-Manufacturing Method of Fifth Embodiment)

Figure 14:
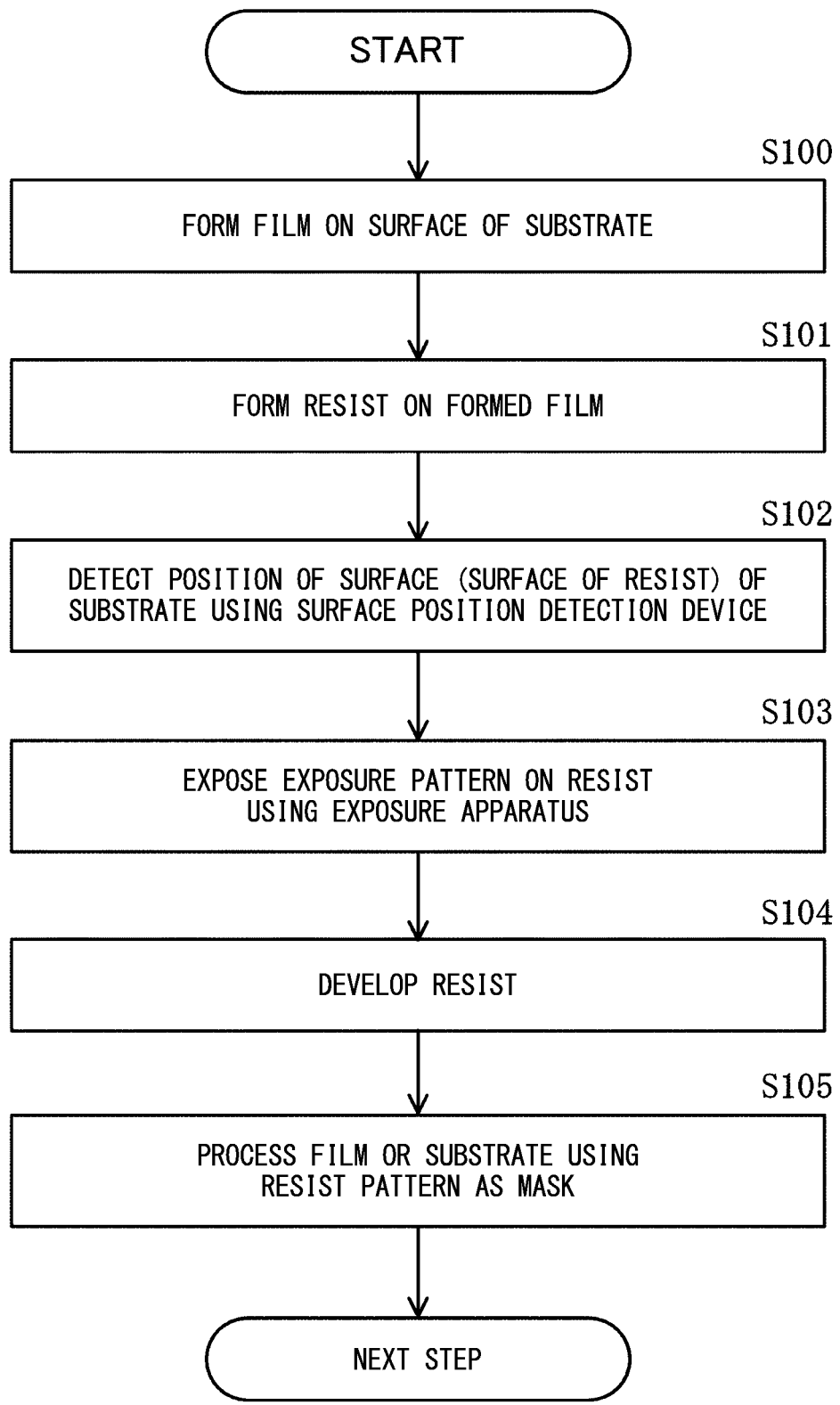
FIG. 14 is a view showing an outline of a device-manufacturing method.

A device-manufacturing method of a fifth embodiment is described with reference to FIG. 14. The device-manufacturing method of the fifth embodiment is a method of manufacturing a device using the exposure apparatus 200 of the third embodiment described above or the substrate-processing system 300 of the fourth embodiment. Accordingly, the details of the operation of the exposure apparatus 200 of the third embodiment and the substrate-processing system 300 of the fourth embodiment are described above.

In step S100, a film formed of a dielectric, a metal, or a semiconductor is formed on a surface of a substrate WF (a semiconductor wafer or a substrate for a display device). Next, in step S101, a photoresist (resist) PR is formed on the film formed in step S100. Then, in step S102, the surface position detection device 100 included in the exposure apparatus 200 of the third embodiment described above or the substrate-processing system 300 of the fourth embodiment is used, and the position of the surface of the resist PR formed on the surface of the substrate WF is detected.

Next, in step S103, by the exposure apparatus 200, an exposure pattern is exposed to the resist PR on the substrate WF using the position of the surface of the resist PR detected by the surface position detection device 100 in step S102. Then, in step S104, the resist PR on which the exposure pattern is exposed is developed, and a resist pattern is formed. Then, in step S105, processing such as etching, ion implantation or the like is performed on the film formed on the substrate WF or the surface of the substrate WF using the resist pattern as a mask.

According to step S100 to step S105 described above, a circuit pattern of one layer that constitutes a device is formed on the substrate WF.

Accordingly, after the completion of step S105, by proceeding to the next step and repeatedly performing step S100 to step S105 again, it is possible to manufacture a device (a semiconductor integrated circuit, a display device, and the like) constituted of a plurality of layers.

(Effects of Device-Manufacturing Method of Fifth Embodiment)

(10) From one point of view, the device-manufacturing method described above includes: forming the resist PR on the surface of the substrate WF; detecting the position of the surface of the resist PR formed on the surface of the substrate WF using the exposure apparatus 200 of the third embodiment described above, setting the surface of the resist PR at a predetermined position in the optical axis (AXP) direction of the projection optical system 57, and exposing the exposure pattern; developing the resist PR; and processing the surface of the substrate WF on the basis of the resist pattern PR formed by the developing.

According to this configuration, it is possible to reduce the measurement error caused by the reflectance distribution at the surface of the substrate WF and perform position alignment of the surface of the substrate WF on which the resist PR is formed with respect to the projection optical system 57 with high accuracy. Thereby, it is possible to form a good exposure pattern on the substrate WF, and eventually, it is possible to manufacture a high-performance device.

(11) From another point of view, the device-manufacturing method described above includes: forming the resist PR on the surface of the substrate WF; and detecting a position in a direction which intersects the surface of a plurality of points in a surface of the resist PR formed on the surface of the substrate WF using the substrate-processing system 300 of the fourth embodiment. The method includes: exposing an exposure pattern while changing the position of the surface of the resist PR in the direction which intersects the surface based on the detected position of the plurality of points; and forming a circuit pattern based on the exposure pattern.

According to this configuration, it is possible to reduce the measurement error caused by the reflectance distribution at the surface of the substrate WF and perform position alignment of the surface of the substrate WF on which the resist PR is formed with respect to the projection optical system 57 with high accuracy. Thereby, it is possible to form a good exposure pattern on the substrate WF, and eventually, it is possible to manufacture a high-performance device.

The present invention is not limited to the embodiments described above. Other aspects conceivable within the scope of the technical ideas of the present invention are also included within the scope of the present invention. The present embodiments may combine all or part of the aspects described above.

DESCRIPTION OF THE REFERENCE SYMBOLS 100, 100a Surface position detection device
200 Exposure apparatus
300 Substrate-processing system
TS Light transmission unit
RS Light reception unit
PU Calculation unit
W Measured object
WA Detected surface
14 Diffraction grating plate
17 Light transmission-side first lens
15 Light transmission-side second lens
18, 19 Mirror
TP Pupil plane
RP1 Pupil plane RP2 Pupil plane
AX1 to AX6 Optical axis
20 Light reception-side first lens
22 Light reception-side second lens
23 Light reception prism
24 Front-side lens group
26 Rear-side lens group
27 Polarization separation prism
28a, 28b Light detection portion
29a, 29b Light reception surface
ST Stage ST
12 Light introduction portion 12
13 Condenser lens
16 Detection light division member
25 Compound separation member
25a Light separation member 25a
25b Spectroscopic member
IA Irradiation region
DA Detection region
DP+1st-order diffraction light
DM−1st-order diffraction light
DL1, DL10 First detection light
DL2, DL20 Second detection light
SL Opening portion
IM1a to IM1c, IM2a to IM2c Image
S1a, S1b Photoelectric conversion signal

The invention claimed is:

1. A surface position detection device that obtains position information of a detected surface along an axis that intersects the detected surface, the surface position detection device comprising:
a light transmission unit by which a plurality of detection lights having a smoothly modulated intensity in the detected surface in a first direction within the detected surface are radiated and superimposed onto the detected surface obliquely from a direction having a direction component in the first direction and which forms an irradiation region on the detected surface;
a light reception unit that has a light detection portion having a light reception surface arranged at an optically conjugated position with respect to the detected surface, receives at a different position of the light reception surface, each of the plurality of detection lights reflected by a detection region of which a width in the first direction is a predetermined value in the irradiation region, and outputs each photoelectric conversion signal of the plurality of detection lights; and
a calculation unit that calculates position information of the detected surface based on the photoelectric conversion signal of the plurality of detection lights output from the light reception unit, wherein
each of the plurality of detection lights is caused to (i) have a modulated intensity in the first direction by a sinusoidal function having an identical period and (ii) have a different phase in the first direction of the sinusoidal function from each other in the detected surface, and
the width of the detection region in the first direction is shorter than half of the period of the sinusoidal function.

2. The surface position detection device according to claim 1,
wherein each of the plurality of detection lights has, in the irradiation region, a constant light intensity in a second direction, the second direction intersecting the first direction.

3. The surface position detection device according to claim 1,
wherein the light transmission unit radiates the plurality of detection lights on the detected surface at an angle equal to each other with respect to a normal line of the detected surface.

4. The surface position detection device according to claim 1,
wherein a sum of the light amounts of the plurality of detection lights in the detection region on the detected surface is constant at an arbitrary position in the first direction.

5. The surface position detection device according to claim 1,
wherein the sinusoidal function by which each of the plurality of detection lights is caused to have the modulated intensity in the first direction has an identical amplitude in the detected surface.

6. The surface position detection device according to claim 5,
wherein the plurality of detection lights comprise a first detection light and a second detection light that have the different phase of the sinusoidal function from each other by half of the period.

7. The surface position detection device according to claim 5,
wherein the plurality of detection lights comprise a first detection light, a second detection light, and a third detection light that have the different phase of the sinusoidal function from one another by one third of the period.

8. The surface position detection device according to claim 1,
wherein the light reception unit comprises: a first light reception optical system that forms a first conjugate surface optically conjugated to the detected surface; a second light reception optical system that forms a second conjugate surface optically conjugated to the first conjugate surface at the conjugated position; and an opening member that is arranged on the first conjugated surface, that has a longitudinal direction in a fourth direction which intersects a third direction having an imaging relationship with the first direction, and that comprises an opening portion having an imaging relationship with the detection region.

9. The surface position detection device according to claim 8,
wherein the second light reception optical system has a light separation member that causes each of the plurality of detection lights which enters the light reception unit via the detection region to enter a different position on the light reception surface.

10. The surface position detection device according to claim 9,
wherein the light separation member is arranged on a pupil surface of the second light reception optical system.

11. The surface position detection device according to claim 8,
wherein a width of an image of the detection region in the light reception surface in a fifth direction having an imaging relationship with the first direction is narrower than a width of the image in a sixth direction that intersects the fifth direction in the light reception surface.

12. The surface position detection device according to claim 8,
wherein the second light reception optical system includes an image plane inclination correction member that causes, with respect to the first conjugate surface inclined relative to an optical axis of the second light reception optical system, the second conjugate surface to be perpendicular relative to the optical axis of the second light reception optical system.

13. The surface position detection device according to claim 1,
wherein the calculation unit calculates position information of the detected surface using a photoelectric conversion signal of the plurality of detection lights on the light reception surface in a region where a width in a fifth direction having an imaging relationship with the first direction is narrower than a width in a sixth direction which intersects the fifth direction.

14. The surface position detection device according to claim 1,
wherein the calculation unit comprises a reflectance calculation portion that calculates a reflectance in the detection region on the detected surface based on an intensity distribution of the detection light on the detected surface and the photoelectric conversion signal of the plurality of detection lights, and
the calculation unit calculates position information of the detected surface based on the calculated reflectance.

15. The surface position detection device according to claim 1,
wherein each of the plurality of detection lights radiated on the detected surface by the light transmission unit has a different wavelength,
the light reception unit comprises a spectroscopic member that disperses each of the plurality of detection lights depending on a wavelength and guides the dispersed detection lights to different positions on the light reception surface,
the light detection portion outputs a photoelectric conversion signal for each of the plurality of different wavelengths that enters a different position with respect to each of the plurality of detection lights, and
the calculation unit calculates position information of the detected surface based on the photoelectric conversion signal of the plurality of detection lights for each of the plurality of different wavelengths.

16. The surface position detection device according to claim 15,
wherein the calculation unit calculates a position information element of the detected surface for each of the plurality of different wavelengths based on the photoelectric conversion signal of the plurality of detection lights for each of the plurality of different wavelengths, statistically processes the calculated position information element for each of the plurality of different wavelengths, and calculates position information of the detected surface.

17. The surface position detection device according to claim 15,
wherein a spectroscopic direction by the spectroscopic member is a fifth direction having an imaging relationship with the first direction on the light reception surface.

18. The surface position detection device according to claim 15,
wherein the spectroscopic member includes a prism having a different refractive power depending on a wavelength.

19. The surface position detection device according to claim 18,
wherein the spectroscopic member includes a plurality of prisms having a different dispersion from each other.

20. The surface position detection device according to claim 1,
wherein the light reception unit comprises a polarization separation member that separates the received detection light into light of a first polarization component and light of a second polarization component that is different from the first polarization component.

21. The surface position detection device according to claim 20,
wherein the light detection unit comprises, as the light reception surface, a first light reception surface that receives the light of the first polarization component and a second light reception surface that receives the light of the second polarization component.

22. The surface position detection device according to claim 20,
wherein the light reception unit outputs, as the photoelectric conversion signal, a first photoelectric conversion signal that corresponds to the light of the first polarization component and a second photoelectric conversion signal that corresponds to the light of the second polarization component, and
the calculation unit calculates position information of the detected surface using the first photoelectric conversion signal and the second photoelectric conversion signal from the light reception unit.

23. The surface position detection device according to claim 1,
wherein the light transmission unit comprises a diffraction grating arranged on an optical path of the plurality of detection lights, and
in each of the plurality of detection lights, an interference fringe by a plurality of diffraction lights from the diffraction grating forms the intensity modulation in the first direction on the detected surface.

24. The surface position detection device according to claim 23,
wherein each of the plurality of detection lights proceeds in a different direction from a surface of the diffraction grating.

25. The surface position detection device according to claim 1,
wherein the light transmission unit comprises a detection light division member that divides an incident light and generates the plurality of detection lights.

26. The surface position detection device according to claim 25,
wherein the light transmission unit has a pupil surface, and the detection light division member is arranged on the pupil surface and deflects at least one of the plurality of detection lights.

27. An exposure apparatus, comprising:
a projection optical system;
a substrate stage on which a substrate is mounted and which moves the substrate; and
a surface position detection device according to claim 1 that detects a position of a surface of the substrate as the detected surface.

28. The exposure apparatus according to claim 27, comprising:
a first position measurement unit that measures a position in an optical axis direction of the projection optical system of at least a portion of the substrate stage at a position where a substrate mounted on the substrate stage faces the surface position detection device; and
a second position measurement unit that measures a position in the optical axis direction of at least a portion of the substrate stage at a position where a substrate mounted on the substrate stage faces the projection optical system.

29. A device-manufacturing method, comprising:
forming a resist on a surface of a substrate;
detecting a position of a surface of the resist formed on the surface of the substrate using the exposure apparatus according to claim 27, setting the surface of the resist at a predetermined position in the optical axis direction of the projection optical system, and exposing an exposure pattern;
developing the resist; and
processing the surface of the substrate based on a resist pattern formed by the developing.

30. A substrate-processing system in which a substrate is a processing target, the substrate-processing system comprising:
a measurement device having a first stage on which the substrate is mounted and the surface position detection device according to claim 1 that measures a position in a direction which intersects the surface of a plurality of points on a surface of the substrate; and
an exposure apparatus that includes a second stage on which the substrate for which the measurement by the measurement device has been completed is mounted and that exposes the substrate which is mounted on the second stage,
wherein the exposure apparatus performs the exposure while changing a position in the direction which intersects the substrate using at least a measurement result by the measurement device.

31. A device-manufacturing method, comprising:
forming a resist on a surface of a substrate;
detecting a position in a direction which intersects the surface of a plurality of points in a surface of the resist formed on the surface of the substrate and exposing an exposure pattern while changing the position of the surface of the resist in the direction which intersects the surface based on the detected position of the plurality of points using the substrate-processing system according to claim 30; and
forming a circuit pattern based on the exposure pattern.

32. A surface position detection device that obtains position information of a detected surface along an axis that intersects the detected surface, the surface position detection device comprising:
a light transmission unit by which a plurality of detection lights having a modulated intensity in the detected surface in a first direction within the detected surface are radiated and superimposed onto the detected surface obliquely from a direction having a direction component in the first direction and which forms an irradiation region on the detected surface;
a light reception unit that has a light detection portion having a light reception surface arranged at an optically conjugated position with respect to the detected surface, receives at a different position of the light reception surface, each of the plurality of detection lights reflected by a detection region of which a width in the first direction is a predetermined value in the irradiation region, and outputs each photoelectric conversion signal of the plurality of detection lights; and
a calculation unit that calculates position information of the detected surface based on the photoelectric conversion signal of the plurality of detection lights output from the light reception unit, wherein
a width of an image of the detection region in the light reception surface in a third direction having an imaging relationship with the first direction is narrower than a width of the image in a fourth direction that intersects the third direction in the light reception surface,
each of the plurality of detection lights is caused to (i) have a modulated intensity in the first direction by a sinusoidal function having an identical period and (ii) have a different phase in the first direction of the sinusoidal function from each other in the detected surface, and
the width of the detection region in the first direction is shorter than half of the period of the sinusoidal function.

33. The surface position detection device according to claim 32,
wherein the light reception unit comprises a light reception optical system,
the light reception optical system comprises an image plane inclination correction member that forms an image of the detected surface inclined relative to a plane perpendicular to an optical axis of a light reception optical system onto a plane perpendicular to an optical axis, and
the light reception surface is arranged to be perpendicular relative to the optical axis of the light reception optical system.

34. A surface position detection device that obtains position information of a detected surface along an axis that intersects the detected surface, the surface position detection device comprising:
a light transmission unit by which a plurality of detection lights having a modulated intensity in the detected surface in a first direction within the detected surface and including a plurality of different wavelengths are radiated and superimposed onto the detected surface obliquely from a direction having a direction component in the first direction and which forms an irradiation region on the detected surface; and
a light reception unit that includes: a light detection portion having a light reception surface arranged at an optically conjugated position with respect to the detected surface; a light separation member that guides each of the plurality of detection lights reflected by a detection region of which a width in the first direction is a predetermined value in the irradiation region to a different position of the light reception surface; and a spectroscopic member that further disperses the detection light depending on a wavelength and guides the dispersed detection light to a different position on the light reception surface, wherein
a spectroscopic direction on the light reception surface is a third direction having an imaging relationship with the first direction,
each of the plurality of detection lights is caused to (i) have a modulated intensity in the first direction by a sinusoidal function having an identical period and (ii)

have a different phase in the first direction of the sinusoidal function from each other in the detected surface, and the width of the detection region in the first direction is shorter than half of the period of the sinusoidal function.

* * * * *